(12) United States Patent
Kang et al.

(10) Patent No.: US 8,637,854 B2
(45) Date of Patent: Jan. 28, 2014

(54) STACKED ORGANIC LIGHT EMITTING DIODE

(75) Inventors: Min-Soo Kang, Daejeon (KR);
Jeoung-Kwen Noh, Daejeon (KR);
Se-Hwan Son, Daejeon (KR);
Jung-Bum Kim, Daejeon (KR)

(73) Assignee: LG Chem, Ltd., Seoul (KR)

( * ) Notice: Subject to any disclaimer, the term of this patent is extended or adjusted under 35 U.S.C. 154(b) by 28 days.

(21) Appl. No.: 12/992,868

(22) PCT Filed: May 15, 2009

(86) PCT No.: PCT/KR2009/002600
§ 371 (c)(1),
(2), (4) Date: Nov. 15, 2010

(87) PCT Pub. No.: WO2009/139607
PCT Pub. Date: Nov. 19, 2009

(65) Prior Publication Data
US 2011/0079774 A1 Apr. 7, 2011

(30) Foreign Application Priority Data
May 16, 2008 (KR) .................. 10-2008-0045361

(51) Int. Cl.
*H01L 29/08* (2006.01)

(52) U.S. Cl.
USPC ....... 257/40; 257/E51.018; 250/226; 250/431

(58) Field of Classification Search
USPC ......... 257/40, E51.018; 250/214.1, 208, 226, 250/431, 423, 457, 459
See application file for complete search history.

(56) References Cited

U.S. PATENT DOCUMENTS 4,780,536 A   10/1988  Czaenik et al.
5,645,948 A   7/1997   Shi et al.
(Continued)

FOREIGN PATENT DOCUMENTS

EP   1 727 396 A1   11/2006
JP   09063771 A    3/1997
(Continued)

OTHER PUBLICATIONS

Shen Z et al.: "Three-Color, Tunable, Organic Light Emitting Devices", Science, American Association for the Advancement of Science, Washington, DC US, vol. 276, No. 5321, Jun. 27, 1997, pp. 2009-2011. XP001024450.

(Continued)

*Primary Examiner* — N Drew Richards
*Assistant Examiner* — Ankush Singal
(74) *Attorney, Agent, or Firm* — McKenna Long & Aldridge, LLP

(57) ABSTRACT

The present invention provides a stacked organic light emitting diode that comprises a first electrode; a second electrode; and at least two light emitting units that are located between the first electrode and the second electrode. The light emitting unit satisfies the following energy relation equation, and includes an n-type organic layer and a p-type organic layer that form NP conjunction, and also includes an n-type doped organic layer that is located between the light emitting units:

$E_{pH} - E_{nL} \leq 1$ eV wherein $E_{nL}$ is a LUMO (lowest unoccupied molecular orbital) energy level of the n-type organic layer and $E_{pH}$ is a HOMO (highest occupied molecular orbital) energy level of the p-type organic layer.

18 Claims, 8 Drawing Sheets

(56) References Cited

U.S. PATENT DOCUMENTS

| | | | |
|---|---|---|---|
| 6,352,777 B1* | 3/2002 | Bulovic et al. | 428/411.1 |
| 6,436,559 B1 | 8/2002 | Ueno et al. | |
| 6,559,473 B1* | 5/2003 | Yu et al. | 257/40 |
| 6,809,308 B2* | 10/2004 | Yonezawa et al. | 250/214.1 |
| 6,878,469 B2 | 4/2005 | Yoon et al. | |
| 7,318,966 B2 | 1/2008 | Tominaga et al. | |
| 7,420,203 B2 | 9/2008 | Tsutsui et al. | |
| 7,494,722 B2* | 2/2009 | Liao et al. | 428/690 |
| 7,550,594 B2 | 6/2009 | Okajima et al. | |
| 7,781,073 B2* | 8/2010 | Kijima | 428/690 |
| 7,816,715 B2* | 10/2010 | Forrest et al. | 257/293 |
| 7,830,089 B2* | 11/2010 | Murano et al. | 313/506 |
| 7,911,135 B2* | 3/2011 | Sakata et al. | 313/506 |
| 2002/0158242 A1 | 10/2002 | Son et al. | |
| 2003/0127967 A1* | 7/2003 | Tsutsui et al. | 313/498 |
| 2003/0170491 A1* | 9/2003 | Liao et al. | 428/690 |
| 2004/0227460 A1* | 11/2004 | Liao et al. | 313/506 |
| 2005/0045808 A1* | 3/2005 | Yonezawa et al. | 250/214 R |
| 2005/0110005 A1* | 5/2005 | Forrest et al. | 257/40 |
| 2005/0255334 A1* | 11/2005 | Kang et al. | 428/690 |
| 2006/0240278 A1* | 10/2006 | Hatwar et al. | 428/690 |
| 2006/0263629 A1* | 11/2006 | Aziz et al. | 428/690 |
| 2006/0289882 A1* | 12/2006 | Nishimura et al. | 257/94 |
| 2007/0122656 A1 | 5/2007 | Klubek et al. | |
| 2007/0141396 A1* | 6/2007 | Chun et al. | 428/690 |
| 2007/0181874 A1* | 8/2007 | Prakash et al. | 257/40 |
| 2007/0181887 A1* | 8/2007 | Kijima et al. | 257/79 |
| 2007/0200490 A1 | 8/2007 | Kawamura et al. | |
| 2007/0221912 A1* | 9/2007 | Jeong et al. | 257/40 |
| 2007/0267958 A1 | 11/2007 | Kitazawa et al. | |
| 2009/0191428 A1* | 7/2009 | Hatwar et al. | 428/690 |
| 2010/0108990 A1 | 5/2010 | Hosokawa et al. | |
| 2010/0117063 A9* | 5/2010 | Kang et al. | 257/40 |
| 2010/0288362 A1* | 11/2010 | Hatwar et al. | 136/263 |
| 2011/0227125 A1* | 9/2011 | Tsutsui et al. | 257/99 |

FOREIGN PATENT DOCUMENTS

| | | |
|---|---|---|
| JP | 2001-527688 | 12/2001 |
| JP | 2004-107263 | 4/2004 |
| JP | 2006-210845 | 8/2006 |
| JP | 2007-039405 | 2/2007 |
| JP | 2007258237 A | 10/2007 |
| JP | 2007-533073 | 11/2007 |
| KR | 10-2003-0067773 | 8/2003 |
| KR | 10-2005-0102361 | 10/2005 |
| KR | 10-2007-0009456 A | 1/2007 |
| KR | 10-2007-0052764 | 5/2007 |
| KR | 10-2007-0118711 | 12/2007 |
| KR | 10-2008-0025385 | 3/2008 |
| WO | WO 98/28767 | 7/1998 |
| WO | WO 2005/097756 | 10/2005 |
| WO | WO 2006/075822 A1 | 7/2006 |
| WO | WO 2007/005200 | 1/2007 |
| WO | WO 2007/011132 A1 | 1/2007 |
| WO | WO 2007/066898 A1 | 6/2007 |
| WO | WO 2007/072741 A1 | 6/2007 |
| WO | WO 2007/083918 A1 | 7/2007 |
| WO | WO 2007/105906 A1 | 9/2007 |
| WO | WO 2008/133483 A2 | 11/2008 |

OTHER PUBLICATIONS

Zheng T et al.: "An effective intermediate Al/Au electrode for stacked color-tunable organic light emitting devices", Applied Physics A; Materials Science & Processing, Springer, Berlin, DE, vol. 91, No. 3, Mar. 11, 2008, pp. 501-506, XP019626647.

H. Ishii, et al.; "Energy Level Alignment and Interfacial Electronic Structures at Organic/Metal and Organic/Organic Interfaces;" Advanced Materials; 1999; pp. 605-625; 11; No. 8.

* cited by examiner (a)

(b)

STACKED ORGANIC LIGHT EMITTING DIODE

This application is a National Stage Entry of International Application No. PCT/KR2009/002600, filed May 15, 2009, and claims the benefit of Korean Application No. 10-2008-0045361, filed on May 16, 2008, which is hereby incorporated by reference for all purposes as if fully set forth herein.

TECHNICAL FIELD

The present invention relates to a stacked organic light emitting diode that has a low energy barrier for injecting holes from an electrode into an organic layer, low driving voltage, and high efficiency and high brightness, and a method for manufacturing the same.

BACKGROUND ART

An organic light emitting device includes generally two electrodes and an organic layer that is inserted into the electrodes. The organic light emitting device converts a current into visible rays by injecting electrons and holes from two electrodes into the organic layer. In order to improve performance, the organic light emitting device may further include an electron/hole injection layer or electron/hole transport layer as well as the organic layer that converts the current into the visible rays.

However, the interface between the electrode that is formed of metal, metal oxides or conductive polymers and the organic layer is unstable. Therefore, heat that is applied from the outside, internal occurrence heat, or an electric field that is applied to devices may negatively affect the performance of the device. In addition, because of a conductive energy level difference between the electron/hole injection layer or the electron/hole transport layer and the other organic layer that is adjacent thereto, a driving voltage for operating devices may be increased. Accordingly, it is important to stabilize the interface between the electron/hole injection layer or the electron/hole transport layer and the other organic layer as well as minimize an energy barrier for injecting electron/hole from the electrode to the organic layer.

The organic light emitting device has been developed so as to control the energy level difference between two or more electrodes and the organic layer that is positioned between the electrodes. In the organic light emitting device, the anode is controlled to have a Fermi energy level that is similar to HOMO (highest occupied molecular orbital) energy level of the hole injection layer, or a material that has the HOMO energy level that is similar to the Fermi energy level of the anode for the hole injection layer is selected. However, since it is required that the hole injection layer is selected in consideration of the Fermi energy level of the anode as well as the HOMO energy level of the hole transport layer or the light emitting layer that is adjacent to the hole injection layer, there is a limit in selecting a material for a hole injection layer. Therefore, while the organic light emitting device is manufactured, in general, a method for controlling the Fermi energy of the anode is adopted. However, a material for anode is limited.

Meanwhile, it is known that a performance characteristic of a device that has a multilayered organic layer is largely affected by a transportation ability of a charge carrier of the organic layer of each layer. While it is operated, a resistor loss occurring in the charge transport layer relates to conductivity, and the conductivity largely affects a required operation voltage as well as a heat load of a device. In accordance with the concentration of the charge carrier of the organic layer, a band bending phenomenon occurs at a point that is close to the contact point between the organic layer and the metal. By this phenomenon, injection of the charge carrier becomes easy, thereby reducing contact resistance.

DISCLOSURE

Technical Problem

It is an object of the present invention to provide a stacked organic light emitting diode that has excellent performance and a simplified manufacturing process by reducing an energy barrier for injecting holes and improving a charge transporting ability of a charge transporting organic material.

Technical Solution

The present invention provides a stacked organic light emitting diode that comprises a first electrode; a second electrode; and at least two light emitting units that are located between the first electrode and the second electrode. The light emitting unit satisfies the following energy relation equation, and comprises an n-type organic layer and a p-type organic layer that form NP conjunction, and comprises an n-type doped organic layer that is disposed between the light emitting units:

$$E_{pH} - E_{nL} \leq 1 \text{ eV}$$

wherein $E_{nL}$ is a LUMO (lowest unoccupied molecular orbital) energy level of the n-type organic layer and $E_{pH}$ is a HOMO (highest occupied molecular orbital) energy level of the p-type organic layer.

Advantageous Effects

A stacked organic light emitting diode according to the present invention includes an n-type organic layer and a p-type organic layer in which light emitting units form NP conjunction, such that the energy barrier for hole injection by the occurrence of charges at the interface of NP conjunction is low and various materials are capable of being used as an electric material. Accordingly, since a process for manufacturing a device can be simplified and an anode and a cathode can be formed by using the same material, the stacked organic light emitting diode that has high brightness can be provided. In addition, unlike a known stacked organic light emitting diode in which an middle conductive layer is provided between light emitting units, in the present invention, in the case of when only the organic layer which is n-type doped between the light emitting units is disposed, it is possible to provide an organic light emitting device in which a plurality of light emitting units are layered and which has high brightness.

In the organic light emitting device according to the present invention, in the case of when the organic layer in which the light emitting unit that contacts with a second electrode is n-type doped is included, since a hole transporting ability and an electron transporting ability are improved, charge balancing in a light emitting region of each light emitting unit can be achieved. Thus, device performances such as efficiency, brightness, driving voltage and the like are excellent.

BEST MODE

Hereinafter, the present invention will be described in detail. However, the accompanying drawings and the following description are given to illustrate but not to limit the present invention, and the present invention may be modified within the scope of the present invention.

A stacked organic light emitting diode according to the present invention comprises a first electrode; a second electrode; and two or more light emitting units that are disposed between the first electrode and the second electrode. The light emitting unit satisfies the following energy relation equation, and includes an n-type organic layer and a p-type organic layer that form NP conjunction, and also includes an n-type doped organic layer that is disposed between the light emitting units:

$$E_{pH} - E_{nL} \leq 1 \text{ eV}$$

wherein $E_{nL}$ is a LUMO (lowest unoccupied molecular orbital) energy level of the n-type organic layer and $E_{pH}$ is a HOMO (highest occupied molecular orbital) energy level of the p-type organic layer.

Figure 3:
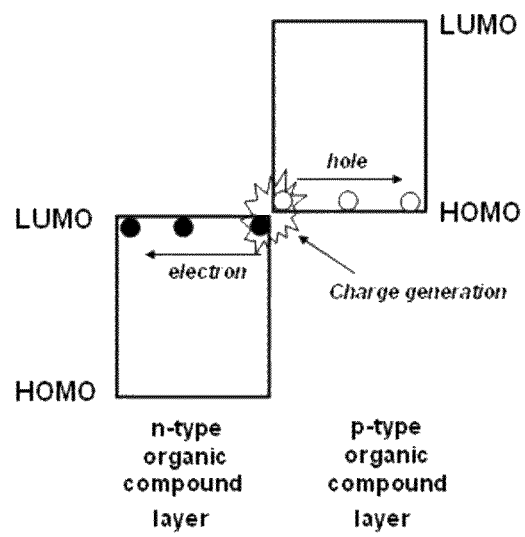
FIG. 3 is a view that illustrates NP conjunction that is formed between the n-type organic layer and the p-type organic layer in the organic light emitting device according an embodiment of the present invention.
Figure 3:
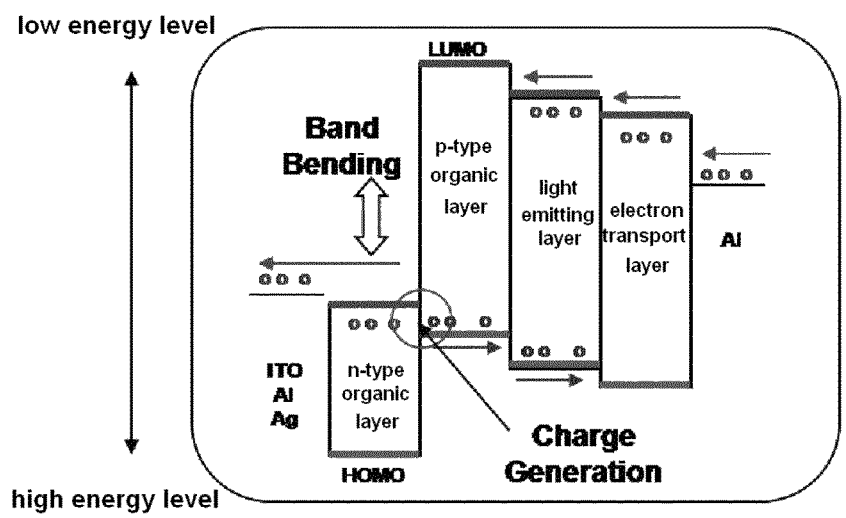

In the stacked organic light emitting diode according to the present invention, NP conjunction is formed in each light emitting unit. FIG. 3 illustrates NP conjunction that is formed between the n-type organic layer and the p-type organic layer.

In the case of when the NP conjunction is formed, the occurrence of charge may be carried out at the LUMO level of the n-type organic layer and the HOMO level of the p-type organic layer. Accordingly, holes or electrons are easily formed by external voltage or a light source. That is, by the NP conjunction, holes are easily formed in the p-type organic layer, and electrons are easily formed in the n-type organic layer. Since the holes and the electrodes are simultaneously generated at the NP conjunction, the electron is transported in a first electrode direction through the LUMO level of the n-type organic layer and the hole is transported in a second electrode direction through the HOMO level of the p-type organic layer.

In the present invention, in order to generate a charge by the NP conjunction, it is preferable that the n-type organic layer has a predetermined LUMO energy level in respects to the HOMO energy level of the p-type organic layer. If the HOMO level of the p-type organic is smaller than the LUMO level of the n-type organic, the occurrence of spontaneous charge can be implemented. For reference, as the energy level is small, the energy value of the electron is large. In order to implement the occurrence of the spontaneous charge, it is required that the HOMO level of the p-type organic is smaller than the LUMO level of the n-type organic, and the value of the energy difference thereof is not particularly limited. In other words, even though a difference between the HOMO level of the p-type organic and the LUMO level of the n-type organic is large, if the HOMO level of the p-type organic is smaller than the LUMO level of the n-type organic, the spontaneous occurrence of charge are ensured.

In the NP conjunction having the above energy correlation, the electron at the HOMO level of the p-type organic is spontaneously moved into the vacant LUMO level of the n-type organic. In this case, holes are generated at the HOMO level of the p-type organic layer, and electrons are generated at the LUMO level of the n-type organic layer. This is a principle of charge generation. At the contrary energy level, the charges are not spontaneously generated, and in this case, in order to generate the charge, a change in vacuum level by dipoles at the interface thereof is required. In the present invention, it is found that the movement of the vacuum level (VL) by the dipolar effect at the NP conjunction interface is possible by about 1 eV and the condition in which the charge can be spontaneously generated is limited to the energy level in which the HOMO level of the p-type organic layer is larger than the LUMO level of the n-type organic layer by 1 eV.

If the HOMO level of the p-type organic and the LUMO level of the n-type organic do not have the above energy correlation, since the NP conjunction between the p-type organic layer and the n-type organic layer is not easily generated, the driving voltage for injecting holes is increased. That is, in the present invention, the NP conjunction means that the n-type organic layer and the p-type organic layer must be physically contacted with each other and the above energy correlation must be satisfied.

In the case of when the charge generation structure is applied to the unit organic light emitting device, a charge injection barrier is reduced and driving of low voltage device can be feasible. In addition, the charge generation layer that has the NP conjunction structure may act as a connection layer of organic light emitting devices of two units when the stacked organic light emitting diode is implemented by layering the unit devices.

In the known organic light emitting device, a method for directly injecting holes from the anode to the HOMO level of the organic is used, but in the present invention, the n-type organic having the large LUMO level is used as the anode or the organic layer that is contacted with the n-type doped organic layer, and the n-type organic and the p-type organic form the NP conjunction. Accordingly, charge generation is implemented by the NP conjunction, and electrons between the electrode or the n-type doped organic layer and the n-type organic layer are moved to the LUMO level of the n-type organic and the n-type doped organic.

In the present invention, it is preferable that in the light emitting unit that is contacted with the first electrode, the n-type organic layer that forms the NP conjunction is contacted with the first electrode and satisfies the following energy correlation equation:

$$0 \text{ eV} < E_{nL} - E_{Fl} \leq 4 \text{ eV}$$

wherein $E_{Fl}$ is a Fermi energy level of the first electrode, and $E_{nL}$ is a LUMO (lowest unoccupied molecular orbital) energy level of the n-type organic layer.

It is preferable that in the light emitting unit other than the light emitting unit that is contacted with the first electrode, the n-type organic layer that forms the NP conjunction is contacted with the n-type doped organic layer.

Since the first electrode is contacted with the NP conjunction structure, the first electrode may be formed of more various materials than materials that can be used as known electrode materials. For example, as the first electrode, materials that include metal, metal oxides, or conductive polymer and the n-type doped organic may be used. The conductive polymer may include the electric conductive polymer. The first electrode may be formed of the same material as the second electrode.

In the present invention, it is found that in the stacked diode, the NP conjunction structure acts as an intermittent connector in conjunction with the n-type doped organic layer, and in the case of when the NP conjunction is used in each unit light emitting device, it is possible to implement a low voltage and long life device. Accordingly, if the charge generation layer which is the NP conjunction structure is included in each unit light emitting device, in the case of when the unit light emitting devices in which the charge generation layer is included are repeatedly layered n times, it is possible to provide the stacked organic light emitting diode in which n unit light emitting devices are layered. Therefore, since the stacked organic light emitting diode can be implemented by the repetition structure of the unit light emitting device without an additional intermittent connection layer, a process of the layered device can be simplified. In addition, since the NP conjunction is used as the layer that is contacted with the first electrode, as compared to the stacked organic light emitting diode that includes n−1 intermittent connector layer having the NP conjunction in the device in which n unit light emitting devices are layered, it is possible to implement the low voltage and long life stacked diode.

The Fermi level of the first electrode and the LUMO level of the n-type organic layer must have a value so that among the electrons and the holes generated in the NP conjunction, the electron of the LUMO level of the n-type organic layer is capable of being moved to the first electrode. In the case of the present invention, it is possible to move charges by a change in vacuum level (VL), formation of gap state or dipoles and the like in accordance with the movement of the free electron of the first electrode at the interface between the first electrode and the n-type organic layer to the LUMO level of the n-type organic layer.

In the present invention, it is more preferable that the energy difference between the Fermi level of the first electrode and the LUMO level of the n-type organic layer is in the range of about 0.01 to 4 eV in views of selection of the material. If the energy difference between the LUMO energy level of the n-type organic layer and the Fermi energy level of the first electrode is larger than 4 eV, a surface dipole of gap state effect in respects to an energy barrier for hole injection is reduced.

The p-type organic layer may include a hole injection layer, a hole transport layer, or a light emitting layer.

The first electrode may include a conductive layer. The conductive layer includes metal, metal oxides, or a conductive polymer and a n-type doped organic. The conductive polymer may include an electric conductive polymer. The first electrode may be formed of the same material as the second electrode.

In the stacked organic light emitting diode according to the present invention, the light emitting unit may include at least one light emitting layer. The organic light emitting device according to the present invention may include additional organic layer in addition to the above organic layer. In the case of when the organic light emitting device according to the present invention further include one or more organic layers, they may be formed of the same material or different materials.

Figure 1:
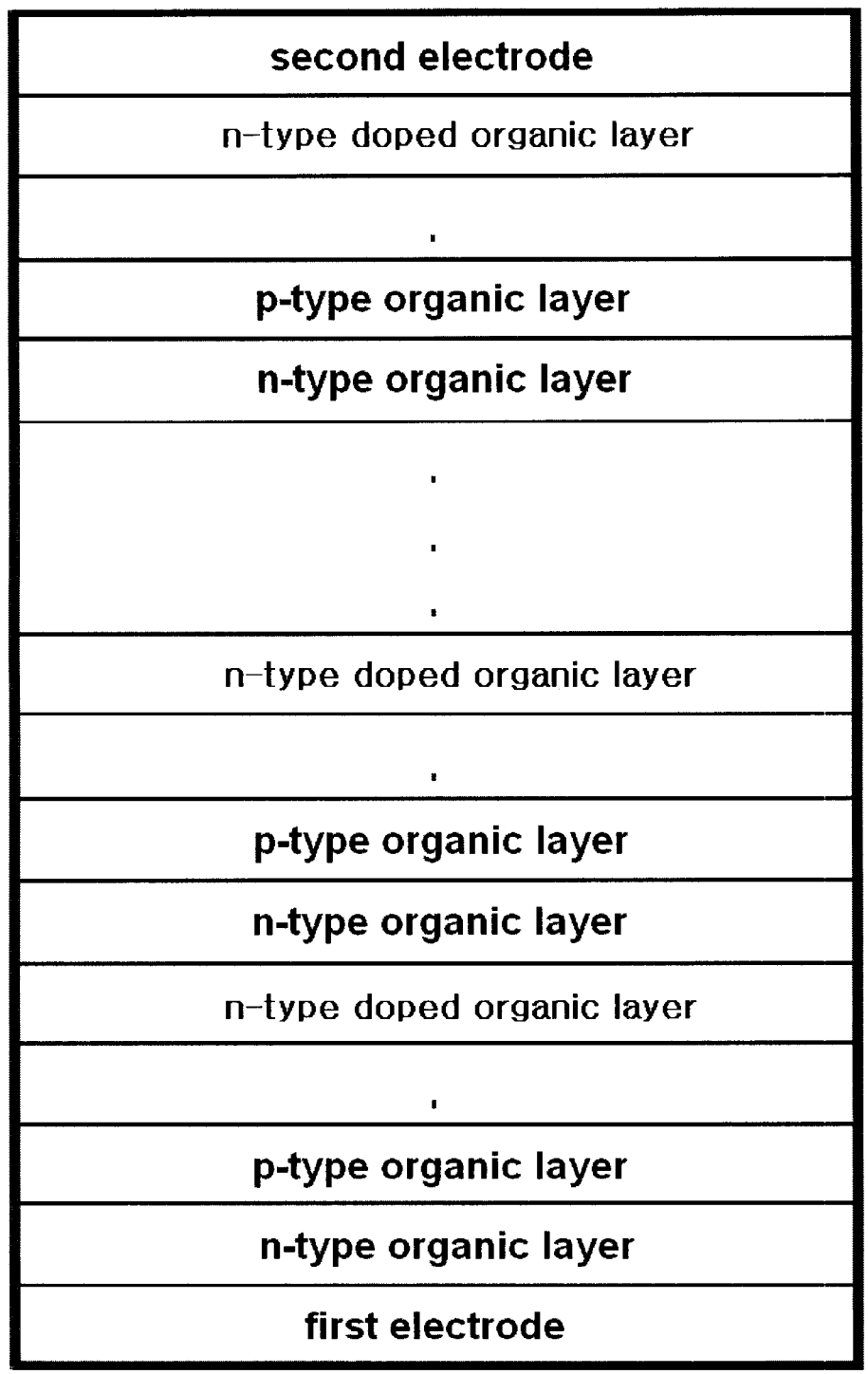
FIG. 1 is a view that illustrates an organic light emitting device according an embodiment of the present invention.

FIG. 1 illustrates the organic light emitting device according to an exemplary embodiment of the present invention. That is, the organic light emitting device according to the present invention includes two or more light emitting units between the first electrode and the second electrode, and the light emitting unit satisfies the above energy correlation equation. The light emitting unit includes an n-type organic layer and a p-type organic layer for forming the NP conjunction, and includes the n-type doped organic layer between the light emitting units. Each of the light emitting units may further include at least one light emitting layer and an organic layer.

In FIG. 1, the first electrode is illustrated as the lower electrode. However, the case of when the first electrode is an upper electrode, and the second electrode is a lower electrode is included in the present invention. In addition, the stacked organic light emitting diode according to the present invention may include two or three or more light emitting units. The layered structure may select the number thereof if necessary, and the upper limit of the number is not particularly limited.

Figure 2:
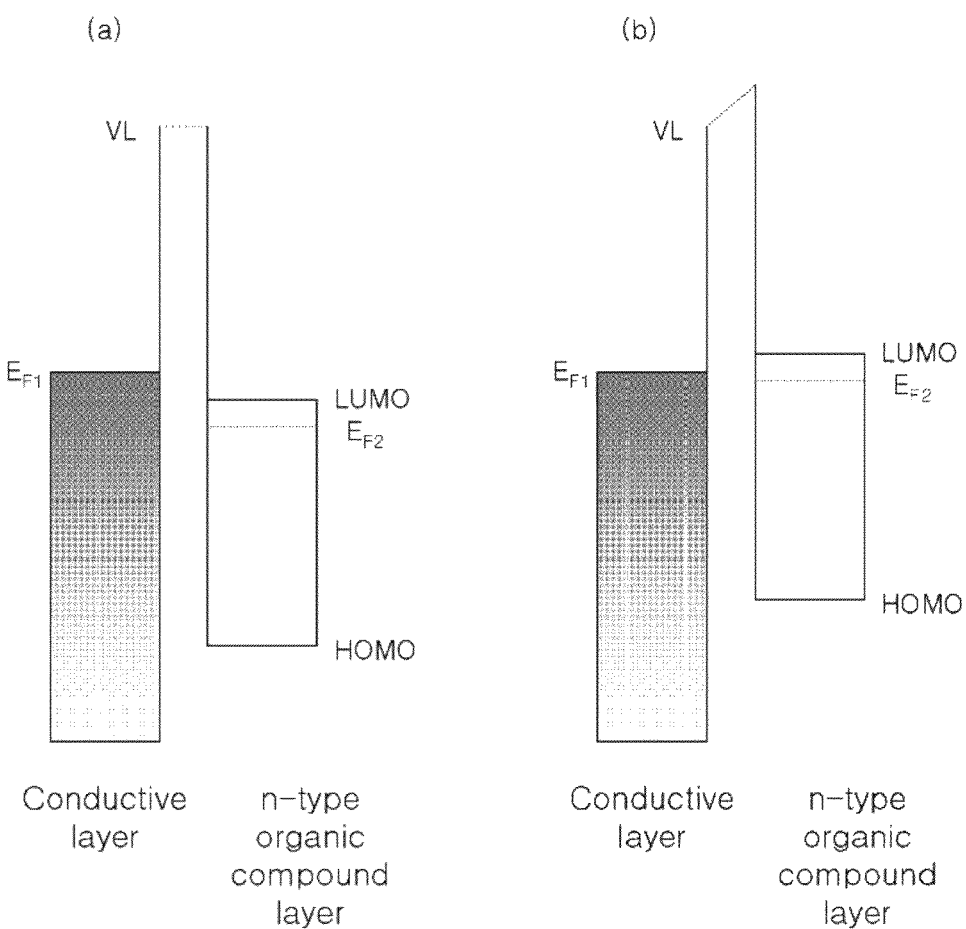
FIGS. 2(a) and 2(b) are a view that illustrates energy levels of a first electrode and an n-type organic layer before and after the n-type organic layer is applied to the first electrode in the organic light emitting device according an embodiment of the present invention.

FIGS. 2(a) and 2(b) illustrate energy level of the first electrode and the n-type organic layer before and after the n-type organic layer is applied to the first electrode in the stacked organic light emitting diode according to an exemplary embodiment of the present invention. In FIG. 2(a), the first electrode has a Fermi energy level ($E_{Fl}$) that is smaller than the LUMO energy level ($E_{nL}$) of the n-type organic layer. The vacuum level (VL) shows the energy level in which electrons are discharged to the air in the first electrode and the n-type organic layer.

In FIG. 2(b), since the electron is moved from the first electrode to the n-type organic layer, the energy levels ($E_{nL}$, $E_{Fl}$) of two layers are the same as each other. In result, the surface dipoles are formed at the interface between the first electrode and the n-type organic layer, and the vacuum level, the Fermi energy level, the HOMO energy level, and the LUMO energy level are changed as shown in FIG. 2(b).

Therefore, even though the difference between the Fermi energy level of the first electrode and the LUMO energy level of the n-type organic layer is large, the energy barrier for injecting holes may be reduced by contacting the first electrode and the n-type organic layer with each other. In addition, in the case of when the first electrode has the Fermi energy level that is smaller than the LUMO energy level of the n-type organic layer, the electron is moved from the first electrode to the n-type organic layer and forms a gap state at the interface between the first electrode and the n-type organic layer. Accordingly, the energy barrier for transporting the electron is minimized.

In addition, the stacked organic light emitting diode according to the present invention includes the n-type doped organic layer between the light emitting units. In the present invention, by increasing the density of the charge carrier of the organic layer by using the n-type doped organic layer, a charge transporting efficiency can be improved in the device, and the stacked organic light emitting diode can be provided without an intermittent conductive layer. In detail, the n-type doping may be implemented by doping an appropriate donor material to the organic layer. Therefore, the density of the charge carrier of the organic layer may be largely increased, and the conductivity of the charge may be largely increased. Thereby, in the stacked organic light emitting diode according to the present invention, balancing in the light emitting region of each light emitting unit can be implemented. Here, the balancing means that they are recombined in the light emitting region, making the densities of the holes and the electrons participating in light emission be the same as each other while being maximized. The organic light emitting device according to the present invention may show much more excellent low voltage and high brightness and high efficiency characteristics.

In particular, in the present invention, as described above, the energy barrier for injecting holes can be largely reduced by the NP conjunction of the n-type organic layer and the p-type organic layer. Therefore, the injection and transporting of the holes from the first electrode to the light emitting region of the organic light emitting device can be efficiently implemented. In the organic light emitting device according to the present invention, in which the hole injection efficiency is high, in the case of when the electron transporting ability is improved by doping the organic or inorganic to the organic layer, the holes and the electrons may reach to the light emitting region of the device at a high concentration. In addition, since the organic light emitting device according to the present invention layers a plurality of light emitting units without an intermittent conductive layer, it may show much more excellent low voltage and high brightness and high efficiency characteristics.

In the present invention, it is preferable that the light emitting unit that is contacted with the second electrode further includes the n-type doped organic layer. At this time, the n-type doped organic layer that is included in the light emitting unit that is contacted with the second electrode may be an electron injection layer, an electron transport layer or an electron injection and transport layer. As described above, in the case of when the light emitting unit that is contacted with the second electrode further includes the n-type doped organic layer, charge balancing can be more efficiently implemented in the light emitting region of each light emitting unit.

Figure 7:
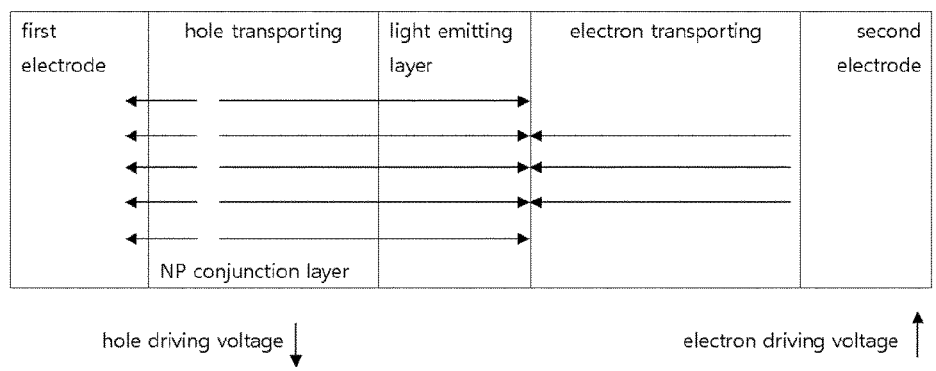
FIG. 7 illustrates movement of electrons and holes of an organic light emitting device that adopts only NP conjunction among the NP conjunction and the n-type doped organic application technologies.

FIG. 7 illustrates movement of electrons and holes of the organic light emitting device adopting only NP conjunction in a technology adopting NP conjunction and an n-type doped organic layer. In the technology adopting the NP conjunction and the n-type doped organic, in the case of the organic light emitting device adopting only the NP conjunction, since only the injection characteristic and the transporting characteristic of the holes are improved, the concentration of the hole in the light emitting layer is relatively higher than the concentration of the electron, such that the balancing of the hole and the electron is reduced. In result, the driving voltage is reduced by improvement of the injection and transporting characteristics of the holes, but the light emitting brightness is reduced. Accordingly, it is impossible to respect an increase in light emitting efficiency which is a Watt ratio that is represented by a multiple of current voltage and light emitting brightness.

Figure 8:
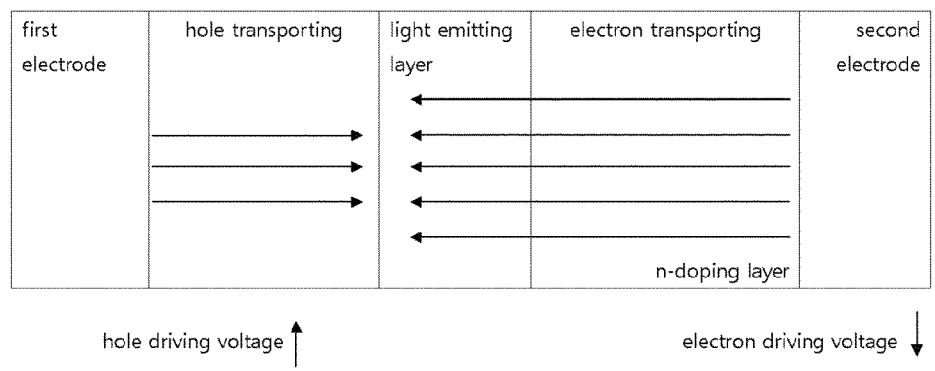
FIG. 8 illustrates movement of electrons and holes of an organic light emitting device that adopts only n-type doped organics among the NP conjunction and the n-type doped organic application technologies.

FIG. 8 illustrates movement of electrons and holes of the organic light emitting device adopting only n-type doped organic in a technology adopting NP conjunction and an n-type doped organic layer. In the technology adopting the NP conjunction and the n-type doped organic, in the case of the organic light emitting device adopting only the n-type doped organic, since only the injection characteristic and the transporting characteristic of the electrons are improved, the concentration of the electron in the light emitting layer is relatively higher than the concentration of the hole, such that the balancing of the hole and the electron is reduced. In result, the driving voltage is reduced by improvement of the injection and transporting characteristics of the electrons, but the light emitting brightness is reduced. Accordingly, it is impossible to respect an increase in light emitting efficiency which is a Watt ratio that is represented by a multiple of current voltage and light emitting brightness.

Figure 9:
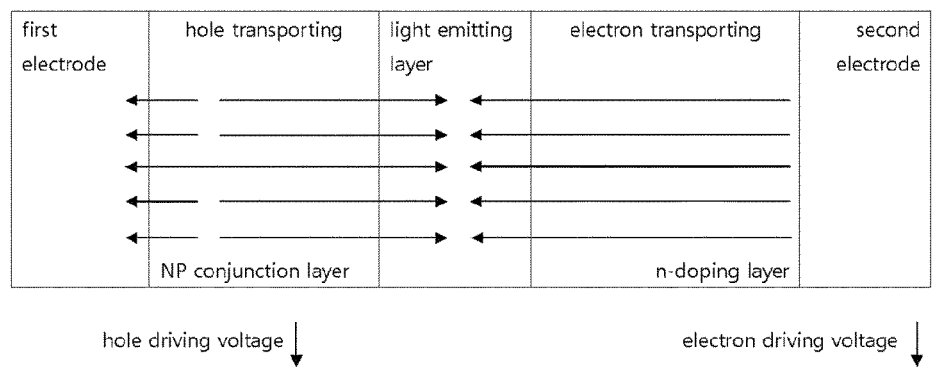
FIG. 9 illustrates movement of electrons and holes of an organic light emitting device that adopts all the NP conjunction and the n-type doped organic application technologies.

FIG. 9 illustrates movement of electrons and holes of the organic light emitting device adopting all NP conjunction and an n-type doped organic layer. In the case of when the NP conjunction and the n-type doped organic are simultaneously used, since an improvement in the injection characteristic and the transporting characteristic of the holes by the NP conjunction and an improvement in the injection characteristic and the transporting characteristic of the electrons simultaneously occur, the concentrations of the electrons and the holes are balanced in the light emitting layer, the driving voltage is largely reduced by an improvement in injection and transporting characteristics of the charge and the brightness is improved by the balancing of the electrons and the holes. Accordingly, it is possible to manufacture the organic light emitting device having high light emitting efficiency which is a Watt ratio that is represented by a multiple of current voltage and light emitting brightness.

Figure 10:
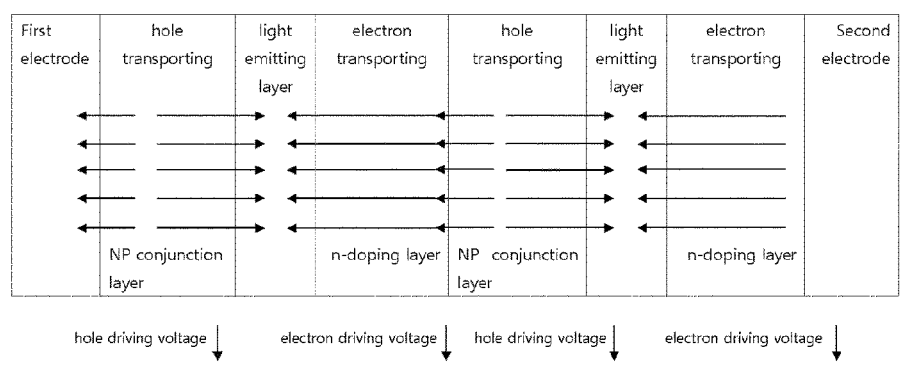
FIG. 10 illustrates movement of electrons and holes of a stacked organic light emitting diode in which two unit organic light emitting devices that adopt all the NP conjunction and the n-type doped organic application technologies are layered.

FIG. 10 illustrates the application of the n-type doped organic layer to the stacked organic light emitting diode as the organic layer in which each light emitting unit includes an NP conjunction structure, the first electrode is contacted with the NP conjunction structure, and which is disposed between the light emitting units and is contacted with the second electrode.

As described above, if the n-times repetition structure of the unit organic light emitting devices between the first electrode and the second electrode is used, it is possible to manufacture the high efficient stacked diode that n-time layering is performed.

In the present invention, the organic material or the inorganic material may be used for n-type doping of the n-type doped organic material layer. For example, the inorganic material includes an alkali metal such as Li, Na, K, Rb, Cs, and the like; an alkali earth metal such as Be, Mg, Ca, Sr, Ba, Ra, and the like; or a metal compound comprising at least one selected from the group consisting of La, Ce, Pr, Nd, Sm, Eu, Tb, Th, Dy, Ho, Er, Em, Gd, Yb, Lu, Y, Mn, and the like. Further, the organic material includes an organic material having cyclopentadiene, cycloheptatriene, six-membered hetero ring, or condensed ring having cyclopentadiene, cycloheptatriene, six-membered hetero ring, and specifically, a xanthene-based, an acridine-based, a diphenylamine-based, an azine-based, an oxazine-based, a thiazine-based, a thioxanthene-based organic material, and the like. A doped organic material may include 2,3,5,6-tetrafluoro-7,7,8,8-tetracyanoquinodimethane (F4TCNQ).

The n-type doping concentration is preferably 0.02 to 50 volume %. The thickness of the n-type doped organic material layer is preferably less than 500 Å. The efficiency of light emitting may decrease by absorbing visible light due to n-type doping materials, in case of using thicker than above thickness. The thickness of the n-type doped organic material layer is more preferably less than 100 Å. The thickness of the n-type doped organic material layer may be 10 Å or more.

In the present invention, the organic material layer n-doped with the organic material or the inorganic material can be formed by a known method in the art, but the scope of the present invention is not limited to a specific method.

For example, the doped organic material layer can be formed by sublimating organic salt, such as HCl salt of pyronin B, so as to prepare a leucobase of an organic material and then evaporating the leucobase along with an organic material to be doped under a vacuum where a substrate, in which the doped organic material layer is to be formed, exists.

Further, the doped organic material layer can be formed by pulverizing an organic material to be doped, such as tetrafluorotetracyanoquinodimethane (TCNQ), in a mortar, mixing the pulverized organic material with a dopant dimmer, for example, di-(p-methoxyphenylamine)methyl, and radiating light onto a mixture so as to cause oxidization of the dimmer and electron transport to TCNQ.

In addition, a method that injects an organic material in an uncharged state, for example, a hydrogenated state as a doping material into the organic material layer to be doped, and converts the uncharged organic material injected into the organic material layer into cations or radicals, may be used.

Specifically, a hydrogenated organic material can be independently manufactured with no material for the organic material layer into which the organic material is doped. For example, the hydrogenated organic material can be manufactured by sublimating an organic salt. If necessary, in order to improve yield and purity of the hydrogenated organic material, an additional purifying process can be performed. The hydrogenated organic material is preferably used in a refined state.

The hydrogenated organic material can be directly injected to the organic material layer to be doped with the organic material by mixture with the material of the organic material layer to be doped with the organic material and evaporation or by successive evaporation. Since the hydrogenated organic material has nonionic neutral molecules, almost complete sublimation is shown. Accordingly, the sublimation of the hydrogenated organic material has the same action as the evaporation of the hydrogenated organic material.

As described above, the positive ions or radicals of the organic material can be formed by injecting the hydrogenated organic material into the organic material layer to be doped and separating hydrogen, carbon monoxide, nitrogen or hydroxyl radical from the hydrogenated organic material. The separation can be performed by radiation of light or electron beams. A radiation spectrum used in the radiation of light preferably at least partially overlaps an absorption region of at least one of the hydrogenated form of uncharged organic material and the material of the organic material layer to be doped with the organic material. N-doping can be performed by a method of moving electrons from the radical formed in the above-described manner to the material of the organic material layer to be doped with the organic material.

In the present invention, hydrogen, carbon monoxide, nitrogen or hydroxyl radical may be separated from cyclopentadiene, cycloheptatriene or six-membered hetero ring of the organic material. In case hydrogen, carbon monoxide, nitrogen or hydroxyl radical is separated from the above-mentioned types of functional groups, electron emission (n-type doping) is achieved by formation of the 6π-aromatic system.

Furthermore, in case cyclopentadiene, cycloheptatriene or hexahetero cycle is a portion of the condensed-ring system, the electron emission or the electron accepting is achieved by formation of 8π-, 10π-, 12π-, or (2n)π- (n is an integer of 7 or more) systems.

The hydrogenated organic material may be a carbinol base or a leuco base of the cation dye. Typically, it is known that the cation dye has high quantum efficiency with respect to optical power of the organic light emitting device. For example, the cation dye, such as rhodamin B, has high light emitting quantum efficiency when the cation dye is used as a light emitting dopant in the organic light emitting device.

Examples of the cation dye include, but are not limited to xanthenes-based dyes, azine-based dyes, oxazine-based dyes, thiazine-based dyes or thioxanthene-based dyes. For example, the compound that is capable of being converted into cations due to the separation of functional groups having hydrides may be used as the cation dye.

Electron injection or transport materials can be used as the material of the organic material layer n-doped with the above material, but it is not limited thereto. For example, the compound having the functional group selected from the group consisting of an imidazole group, an oxazole group, a thiazole group, a quinoline group and a phenanthroline group can be used.

Preferred examples of the compound having the functional group that is selected from the group consisting of the imidazole group, the oxazole group, and the thiazole group include a compound that is represented by the following Formula 1 or 2.

[Formula I]

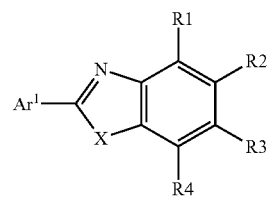

In the above Formula 1, $R^1$ to $R^4$ may be the same or different from each other, are each independently a hydrogen atom; a $C_1$ to $C_{30}$ alkyl group that is unsubstituted or substituted with one or more groups selected from the group consisting of a halogen atom, an amino group, a nitrile group, a nitro group, a $C_1$ to $C_{30}$ alkyl group, a $C_2$ to $C_{30}$ alkenyl group, a $C_1$ to $C_{30}$ alkoxy group, a $C_3$ to $C_{30}$ cycloalkyl group, a $C_3$ to $C_{30}$ heterocycloalkyl group, a $C_5$ to $C_{30}$ aryl group, and a $C_2$ to $C_{30}$ heteroaryl group; a $C_3$ to $C_{30}$ cycloalkyl group that is unsubstituted or substituted with one or more groups selected from the group consisting of a halogen atom, an amino group, a nitrile group, a nitro group, a $C_1$ to $C_{30}$ alkyl group, a $C_2$ to $C_{30}$ alkenyl group, a $C_1$ to $C_{30}$ alkoxy group, a $C_3$ to $C_{30}$ cycloalkyl group, a $C_3$ to $C_{30}$ heterocycloalkyl group, a $C_5$ to $C_{30}$ aryl group, and a $C_2$ to $C_{30}$ heteroaryl group; a $C_5$ to $C_{30}$ aryl group that is unsubstituted or substituted with one or more groups selected from the group consisting of a halogen atom, an amino group, a nitrile group, a nitro group, a $C_1$ to $C_{30}$ alkyl group, a $C_2$ to $C_{30}$ alkenyl group, a $C_1$ to $C_{30}$ alkoxy group, a $C_3$ to $C_{30}$ cycloalkyl group, a $C_3$ to $C_{30}$ heterocycloalkyl group, a $C_5$ to $C_{30}$ aryl group, and a $C_2$ to $C_{30}$ heteroaryl group; or a $C_2$ to $C_{30}$ heteroaryl group that is unsubstituted or substituted with one or more groups selected from the group consisting of a halogen atom, an amino group, a nitrile group, a nitro group, a $C_1$ to $C_{30}$ alkyl group, a $C_2$ to $C_{30}$ alkenyl group, a $C_1$ to $C_{30}$ alkoxy group, a $C_3$ to $C_{30}$ cycloalkyl group, a $C_3$ to $C_{30}$ heterocycloalkyl group, a $C_5$ to $C_{30}$ aryl group, and a $C_2$ to $C_{30}$ heteroaryl group, and may form an aliphatic, aromatic, aliphatic hetero, or aromatic hetero condensation ring or a spiro bond in conjunction with a neighboring group; $Ar^1$ is a hydrogen atom, a substituted or unsubstituted aromatic ring or a substituted or unsubstituted aromatic hetero ring; X is O, S, or $NR^a$, and $R^a$ is hydrogen, a $C_1$ to $C_7$ aliphatic hydrocarbon, an aromatic ring or an aromatic hetero ring.

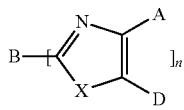

[Formula 2]

In the above Formula 2, X is O, S, $NR^b$ or a $C_1$ to $C_7$ divalent hydrocarbon group; A, D, and $R^b$ are each a hydrogen atom, a nitrile group (—CN), a nitro group (—NO$_2$), a $C_1$ to $C_{24}$ alkyl, a $C_5$ to $C_{20}$ aromatic ring or a hetero-atom substituted aromatic ring, a halogen, or an alkylene or an alkylene containing a hetero-atom that can form a fused ring in conjunction with an adjacent ring; A and D may be connected to each other to form an aromatic or hetero aromatic ring; B is a linkage unit and substituted or unsubstituted alkylene or arylene that conjugately or unconjugately connects multiple hetero rings when n is 2 or more, and substituted or unsubstituted alkyl or aryl when n is 1; and n is an integer in the range of 1 to 8.

Examples of the compound that is represented by the above Formula 1 include a compound that is disclosed in Korean Patent Application Publication No. 2003-0067773, and examples of the compound that is represented by the above Formula 2 include a compound that is disclosed in U.S. Pat. No. 5,645,948 and a compound that is disclosed in WO05/097756. The disclosures of above-mentioned documents are incorporated herein by reference in its entirety.

Specifically, the compound that is represented by the above Formula 1 includes the compound that is represented by the following Formula 3.

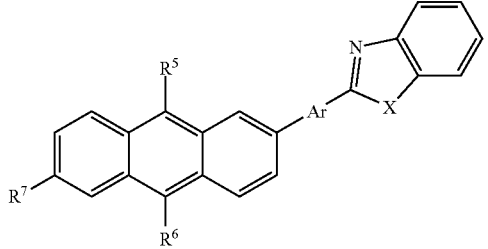

[Formula 3]

In the above Formula 3, $R^5$ to $R^7$ are the same or different from each other, are each independently a hydrogen atom, a $C_1$ to $C_{20}$ aliphatic hydrocarbon, an aromatic ring, an aromatic hetero ring or an aliphatic or aromatic fused ring; Ar is a direct bond, an aromatic ring, an aromatic hetero ring or an aliphatic or aromatic fused ring; and X is O, S, or $NR^a$, $R^a$ is a hydrogen atom, a $C_1$ to $C_7$ aliphatic hydrocarbon, an aromatic ring, or an aromatic hetero ring, with a proviso that $R^5$ and $R^6$ can not simultaneously be hydrogen.

In addition, the compound that is represented by the above Formula 2 includes the compound that is represented by the following Formula 4.

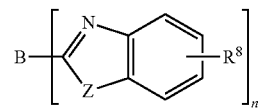

[Formula 4]

In the above Formula 4, Z is O, S, or $NR^b$, $R^8$ and $R^b$ are a hydrogen atom, a $C_1$ to $C_{24}$ alkyl, a $C_5$ to $C_{20}$ aromatic ring or a hetero-atom substituted aromatic ring, a halogen, or an alkylene or an alkylene containing a hetero-atom that can form a fused ring in conjunction with a benzazole ring; B is a linkage unit and alkylene, arylene, substituted alkylene, or substituted arylene that conjugately or unconjugately connects multiple benzazoles when n is 2 or more and substituted or unsubstituted alkyl or aryl when n is 1, and n is an integer in the range of 1 to 8.

Examples of the preferable compound having an imidazole group include compounds having the following structures.

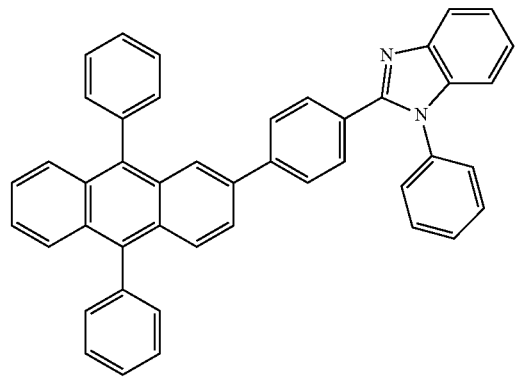

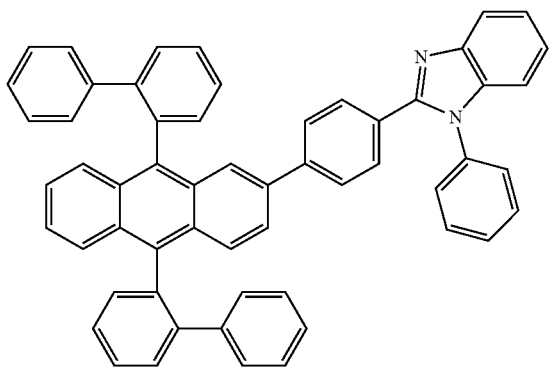

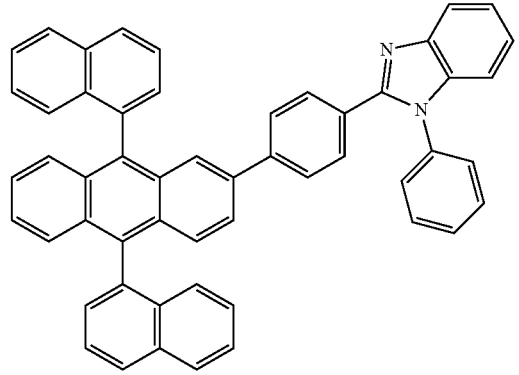

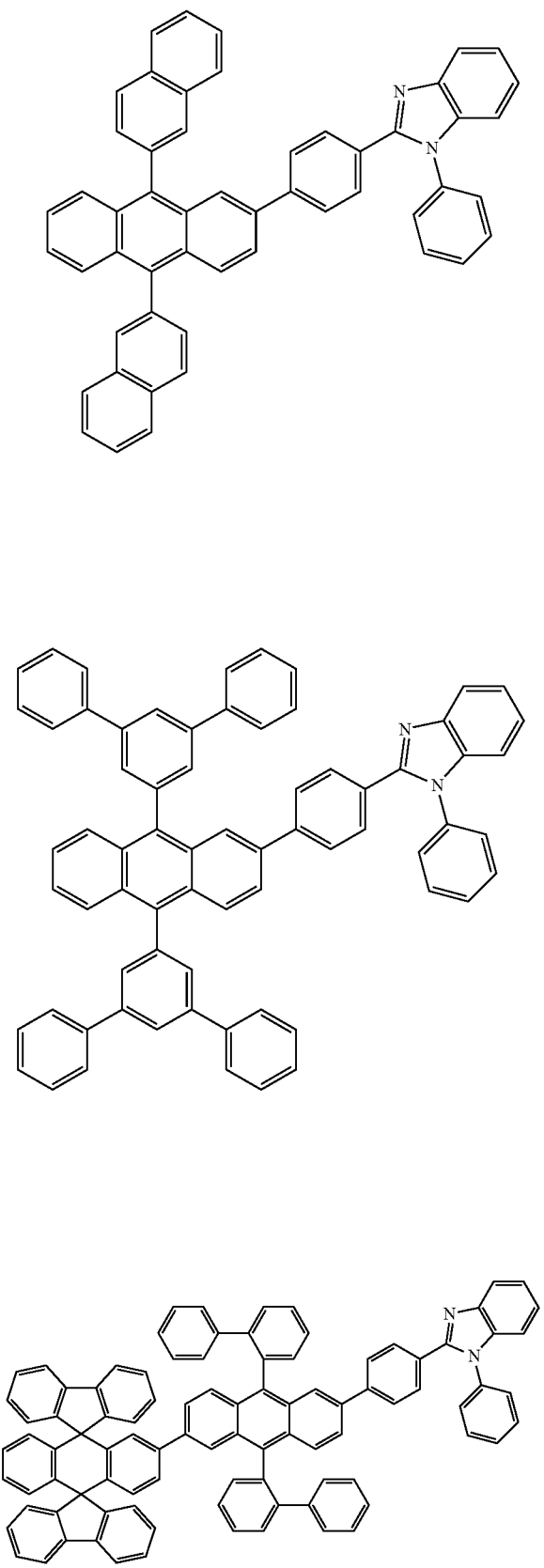
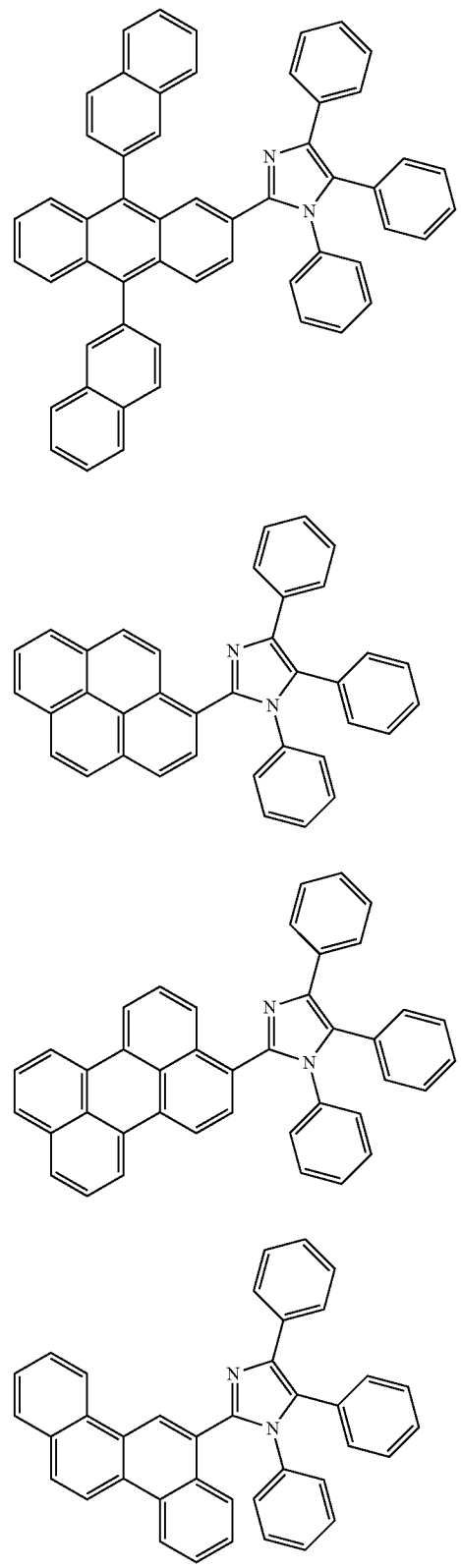
Examples of the compound having the quinoline group include compounds that are represented by the following Formulae 5 to 11.

[Formula 5]
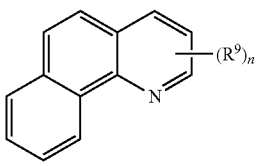

[Formula 6]
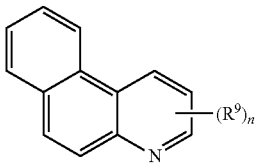

[Formula 7]
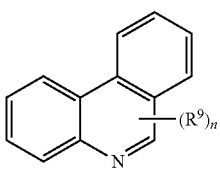

[Formula 8]
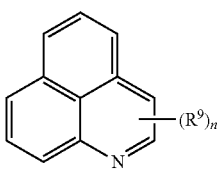

[Formula 9]
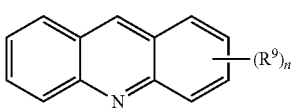

[Formula 10]
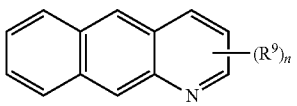

[Formula 11]
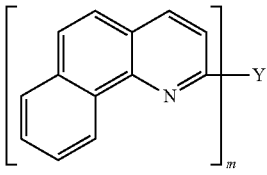

Wherein n is an integer in the range of 0 to 9, m is an integer in the range of 2 or more, $R^9$ is one selected from the group consisting of hydrogen, an alkyl group such as methyl and ethyl, a cycloalkyl group such as cyclohexyl and a norbornyl, an aralkyl group such as benzyl group, an alkenyl group such as vinyl and allyl, a cycloalkenyl group such as cyclopentadienyl and cyclohexenyl, an alkoxy group such as methoxy, an alkylthio group in which an oxygen atom in ether bonding of an alkoxy group is substituted by a sulfur atom, an arylether group such as phenoxy, an arylthioether group in which an oxygen atom in ether bonding of an arylether group is substituted by a sulfur atom, an aryl group such as phenyl, naphthyl and biphenyl, a heterocyclic group such as furyl, thienyl, oxazolyl, pyridyl, quinolyl, carbazolyl, halogen, a cyano group, an aldehyde group, a carbonyl group, a carboxyl group, an ester group, a carbamoyl group, an amino group, a nitro group, a silyl group such as trimethylsilyl, a siloxanyl group having silicon by ether bonding, and a ring structure that is formed in conjunction with an adjacent group; the above substituent groups may be unsubstituted or substituted, and the above substitutent groups are the same or different from each other when n is 2 or more, and Y is a group having 2 or more valence of the above-mentioned $R^9$ groups.

The compounds of Formulae 5 to 11 are disclosed in Korean Patent Application Publication No. 2007-0118711, the disclosures of which are incorporated herein by reference in its entirety.

Examples of the compound having a phenanthroline group include compounds that are represented by the following Formulae 12 to 22.

[Formula 12]
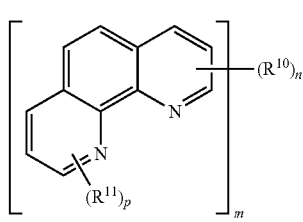

[Formula 13]
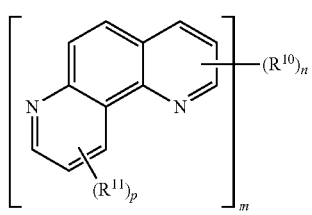

[Formula 14]
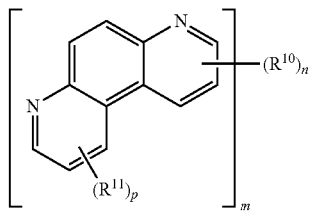

[Formula 15]
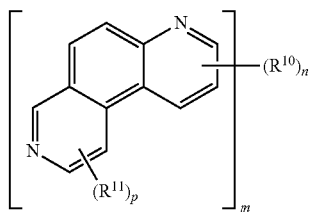

wherein m is an integer of 1 or more, n and p are integers, n+p is 8 or less, when m is 1, $R^{10}$ and $R^{11}$ are each one selected from the group consisting of hydrogen, an alkyl group such as methyl and ethyl, a cycloalkyl group such as cyclohexyl and a norbornyl, an aralkyl group such as benzyl group, an alkenyl group such as vinyl and allyl, a cycloalkenyl group such as cyclopentadienyl and cyclohexenyl, an alkoxy group such as methoxy, an alkylthio group in which an oxygen atom in ether bonding of an alkoxy group is substituted by a sulfur atom, an arylether group such as phenoxy, an arylthioether group in which an oxygen atom in ether bonding of an arylether group is substituted by a sulfur atom, an aryl group such as phenyl, naphthyl and biphenyl, a heterocyclic group such as furyl, thienyl, oxazolyl, pyridyl, quinolyl, carbazolyl, halogen, a cyano group, an aldehyde group, a carbonyl group, a carboxyl group, an ester group, a carbamoyl group, an amino group, a nitro group, a silyl group such as trimethylsilyl, a siloxanyl group having silicon by ether bonding, and a ring structure that is formed in conjunction with an adjacent group;

when m is 2 or more, $R^{10}$ is a direct bond or a group having 2 or more valence of the above-mentioned groups, and $R^{11}$ is the same as the above-mentioned groups;

the above substituent groups may be unsubstituted or substituted, and the above substitutent groups are the same or different from each other when n or p is 2 or more.

The compounds of Formulae 12 to 15 are disclosed in Korean Patent Application Publication Nos. 2007-0052764 and 2007-0118711, the disclosures of which are incorporated herein by reference in its entirety.

[Formula 16]

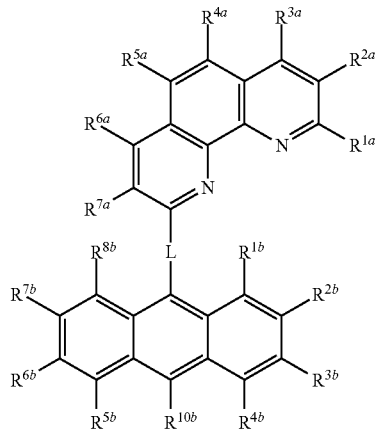

[Formula 17]

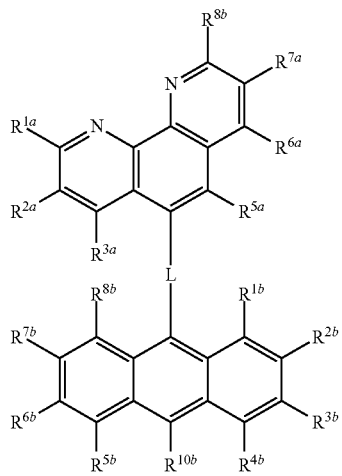

[Formula 18]

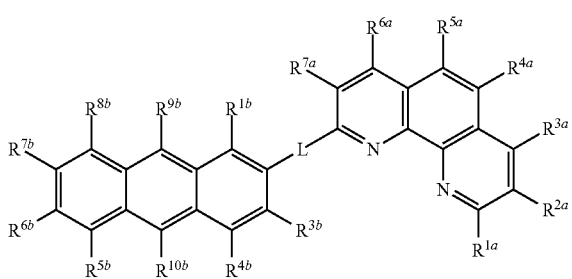

[Formula 19]

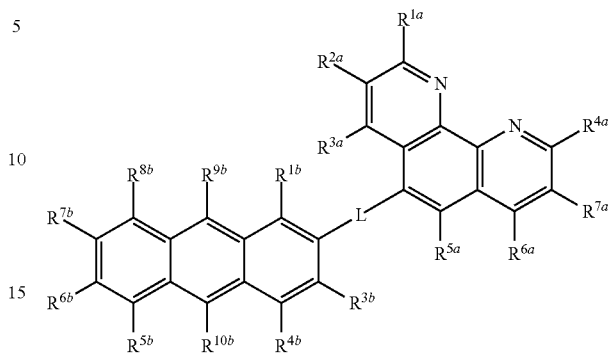

In the Formulae 16 to 19, $R^{1a}$ to $R^{8a}$ and $R^{1b}$ to $R^{10b}$ are independently selected from the group consisting of a hydrogen atom, a substituted or unsubstituted aryl group having 5-60 nuclear atoms, a substituted or unsubstituted pyridyl group, a substituted or unsubstituted quinolyl group, a substituted or unsubstituted alkyl group having 1-50 carbon atoms, a substituted or unsubstituted cycloalkyl group having 3-50 carbon atoms, a substituted or unsubstituted aralkyl group having 6~50 nuclear atoms, a substituted or unsubstituted alkoxy group having 1-50 carbon atoms, a substituted or unsubstituted aryloxy group having 5-50 nuclear atoms, a substituted or unsubstituted arylthio group having 5-50 nuclear atoms, a substituted or unsubstituted alkoxycarbonyl group having 1-50 carbon atoms, an amino group substituted by a substituted or unsubstituted aryl group having 5-50 nuclear atoms, a halogen atom, a cyano group, a nitro group, a hydroxyl group and a carboxyl group, wherein the substituents are bonded each other to form an aromatic group; and L is a substituted or unsubstituted arylene group having 6-60 carbon atoms, a substituted or unsubstituted pyridynylene group, a substituted or unsubstituted quinolinylene group, or a substituted or unsubstituted fluorenylene group. The compounds of Formulae 16-19 are disclosed in Japanese Patent Application Publication No. 2007-39405, the disclosures of which are incorporated herein by reference in its entirety.

[Formula 20]

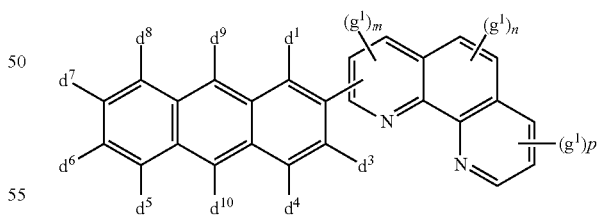

[Formula 21]

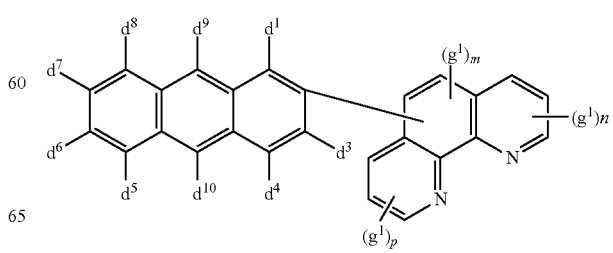

In the Formulae 20 and 21, $d^1$, $d^3$ to $d^{10}$ and $g^1$ are independently selected from the group consisting of a hydrogen atom and an aromatic or aliphatic hydrocarbon group, m and n are integers of 0 to 2, p is an integer of 0 to 3. The compounds of Formulae 20 and 21 are disclosed in U.S. Patent Application Publication No. 2007/0122656, the disclosures of which are incorporated herein by reference in its entirety.

[Formula 22]

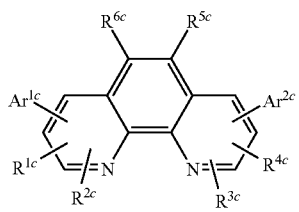

In the Formula 22, $R^{1c}$ to $R^{6c}$ are independently selected from the group consisting of a hydrogen atom, a substituted or unsubstituted alkyl group, a substituted or unsubstituted aralkyl group, a substituted or unsubstituted aryl group, a substituted or unsubstituted heterocyclic group and a halogen atom, and $Ar^{1c}$ and $Ar^{2c}$ are independently selected from the following formulae:

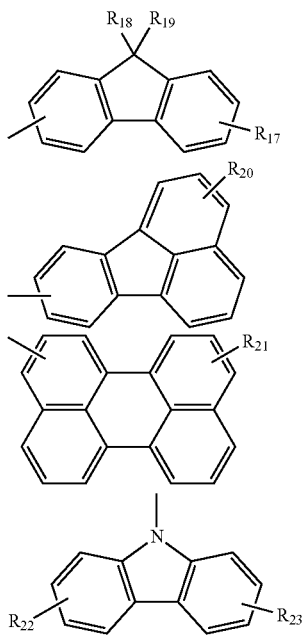

wherein $R_{17}$ to $R_{23}$ are independently selected from the group consisting of a hydrogen atom, a substituted or unsubstituted alkyl group, a substituted or unsubstituted aralkyl group, a substituted or unsubstituted aryl group, a substituted or unsubstituted heterocyclic group and a halogen atom. The compound of Formula 22 is disclosed in Japanese Patent Application Publication No. 2004-107263, the disclosures of which are incorporated herein by reference in its entirety.

The stacked organic light emitting diode according to the present invention is known in the field of surgery to pull the foregoing structure can be fabricated. According to the present invention, a method of manufacturing the organic light emitting diode, each layer of material and the n-type doping, the same method described above, so that specific information about this is omitted.

Figure 4:
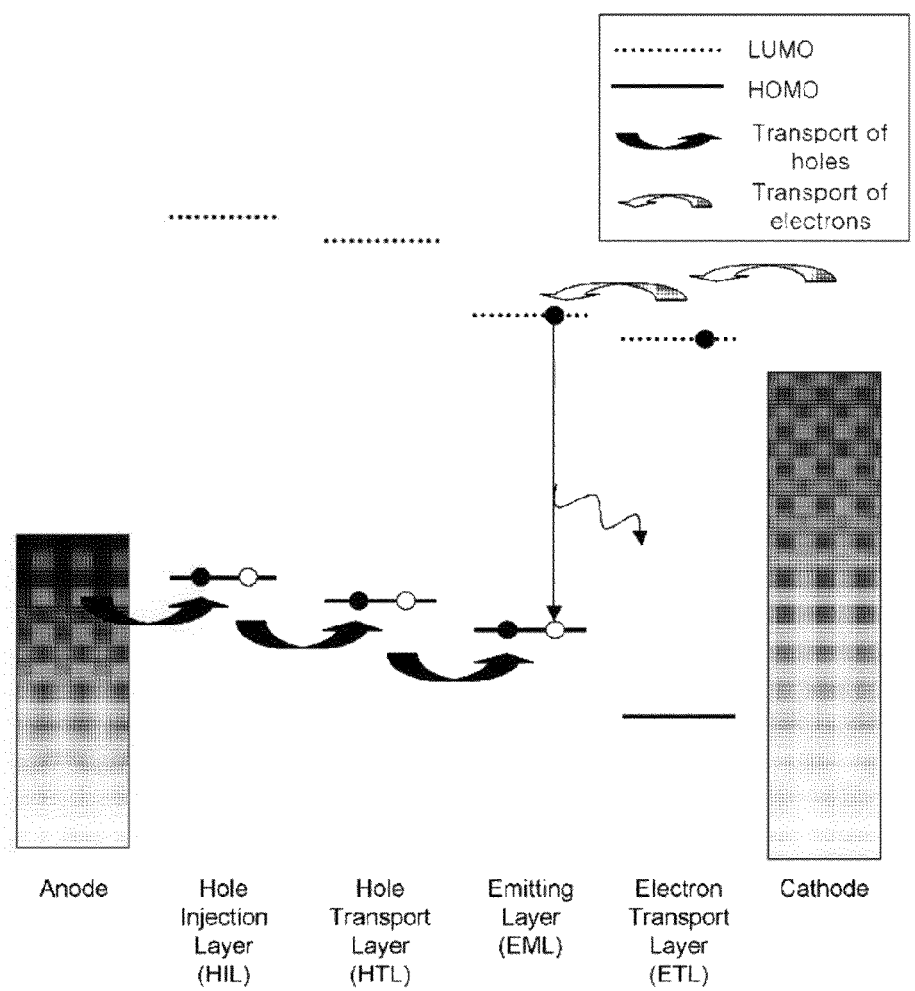
FIG. 4 is a view that illustrates an energy level of an organic light emitting device according to the related art.

FIG. 4 is a view that illustrates an energy level of an organic light emitting device according to the related art. With this energy level, the energy loss for injecting the holes and electrons from the anode and the cathode, respectively, is minimized.

Figure 5:
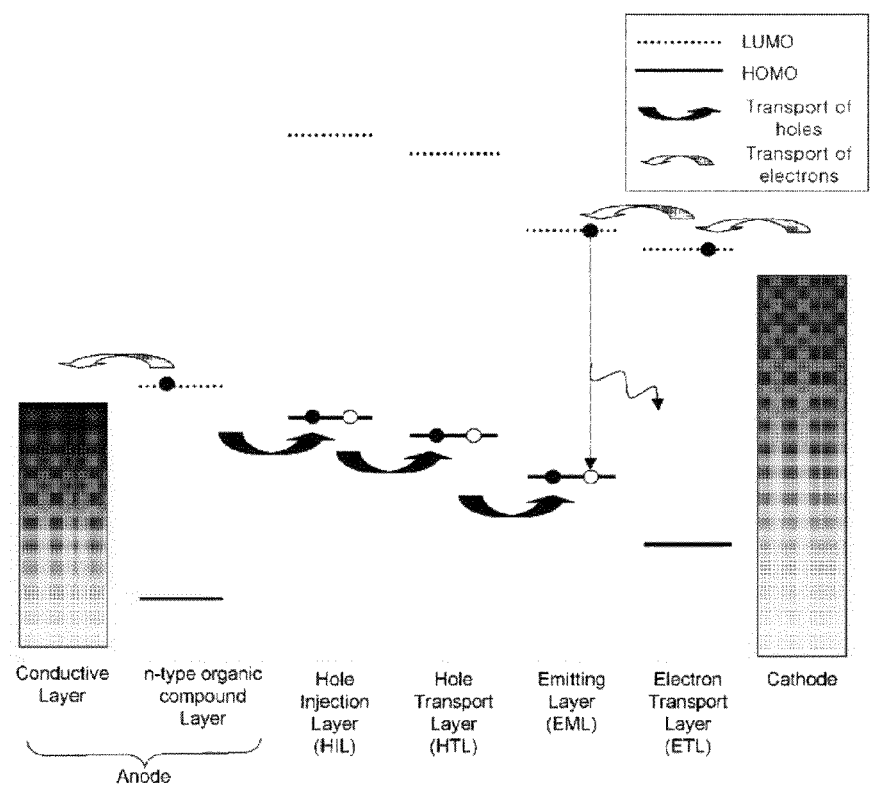
FIG. 5 is a view that illustrates an energy level of an organic light emitting device according to an embodiment of the present invention.

FIG. 5 illustrates energy level of the organic light emitting device comprising one light emitting unit according to the embodiment of the invention. With reference to FIG. 5, the organic light emitting device according to the embodiment of the invention includes the anode, the n-type organic material layer, the p-type hole injection layer (HIL), the hole transport layer (HTL), the emitting layer (EML), the electron transport layer (ETL), and the cathode. The difference in energy between the LUMO energy level of the n-type organic material layer of the anode and the Fermi energy level of the anode is about 4 eV or less, and the difference in energy between the LUMO energy level of the n-type organic material layer and the HOMO energy level of the p-type hole injection layer satisfies following formula.

$E_{pH} - E_{nL} \leq 1$ eV

Since the energy barrier for injection of the holes/electrons is lowered by the n-type organic material layer, the holes are easily transported from the anode to the emitting layer using the LUMO energy level of the n-type organic layer and the HOMO energy level of the p-type hole injection layer.

Because the n-type organic layer of the anode lowers the energy barrier for injecting holes from the anode to the p-type hole transporting layer, the anode can be formed of various conductive materials. The anoder, for example, can be formed of the same materials to the cathode. When the anode is formed of the same material to the cathode, such as, the conductive material having low work function, a stacked organic luminescence device can be manufactured.

Further, the subject invention can achieve the balancing of holes and electrons by improving the transport properties of holes and electrons by the above technical constitutions. Therefore, even though an electron injection layer made of materials such as LiF is not included, the present invention can achieve the device performance higher than that of an organic light emitting device having an electron injection layer such as a LiF layer. At this time, the organic compound layer n-doped with alkali earth metal may be contact with the second electrode. However, the present invention does not exclude to comprise an electron injection layer from the scope.

The present invention can provide with a stacked organic light emitting device having a high efficiency and a high luminance by the above described principle. Because a brightness is increased in proportion to the number of the staked organic luminescence devices operated in response to the same driving voltage, the stacked organic luminescence device has an improved brightness.

The stacked organic light emitting diode according to the present invention may have an inverted structure in which a cathode, an organic layer and an anode are sequentially formed from the bottom on a substrate. In other words, in the stacked organic light emitting diode according to the present invention, the second electrode may be a bottom electrode located on the substrate and the first electrode may be an upper electrode, wherein the first electrode is an anode and the second electrode is a cathode. In addition, the stacked organic light emitting diode according to the present invention may have an inverted structure in which an anode, an organic layer and a cathode are sequentially formed from the bottom on a substrate. In other words, the first electrode may be a bottom electrode located on the substrate and the second electrode may be an upper electrode, wherein the first electrode is an anode and the second electrode is a cathode.

Hereinafter, each layer of the organic luminescence device according to an exemplary embodiment of the present invention is illustrated. Each layer can be formed of a single compound or a combination of two or more compounds.

First Electrode

The first electrode includes a conductive layer. The conductive layer includes metal, metal oxide or a conductive polymer. The conductive polymer may include an electrically conductive polymer.

Since the n-type organic layer that is included in the organic light emitting device reduces the energy barrier for injecting holes from the first electrode to the p-type organic layer, the first electrode may be formed of various conductive materials. For example, it has the Fermi energy level that is in the range of about 2 to 5.5 eV. In the known organic light emitting device, only material that has the Fermi energy level that is in the range of 5 to 6 eV may be used as the first electrode. However, in the present invention, material that has the Fermi energy level that is in the range of 2 to 5 eV, in particular, material that has the Fermi energy level that is in the range of 2 to 4 eV can be used. Examples of the conductive material include carbon, cesium, potassium, lithium, calcium, sodium, magnesium, indium, aluminium, silver, tantalum, vanadium, chrome, copper, zinc, iron, tungsten, molybdenum, nickel, gold, other metal and an alloy thereof; zinc oxides, indium oxides, tin oxides, indium tin oxides (ITO), indium zinc oxides and other similar metal oxides; a mixture of oxides and metal such as $ZnO:Al$ and $SnO_2:Sb$ and the like. In the case of when the organic light emitting device is a front light emitting type, a transparent material and an opaque material that has excellent light reflectivity may be used as the conductive layer. In the case of the rear light emitting type organic light emitting device, a transparent material must be used as the first electrode. If an opaque material is used, it is required that it is formed in a thin film so as to be transparent.

In order to control the Fermi energy level of the first electrode, the surface of the conductive layer can be treated with nitrogen plasma or oxygen plasma.

The Fermi level of the first electrode by the plasma treatment is increased by oxygen plasma treatment, and reduced by the nitrogen plasma treatment.

In addition, in the case of the nitrogen plasma, the conductivity of the first electrode can be increased, and a life span of the device can be increased by generating nitrides on the surface while the concentration of oxygen on the surface is reduced. However, since the Fermi level of the first electrode is reduced and it is difficult to inject holes, there is a problem in that the driving voltage is increased.

In the case of when the NP conjunction structure is used as described in the present invention, even though the Fermi level of the first electrode is reduced, since it does not affect a hole injection characteristic by the NP conjunction, the nitrogen plasma treatment can be possible, thereby implementing a long life and low voltage device.

Organic Layer

The stacked organic light emitting diode according to the present invention comprises at least two light emitting units that are located between the first electrode and the second electrode, and the light emitting units each comprise an n-type organic layer and a p-type organic layer that form NP conjunction. In addition, the stacked organic light emitting diode according to the present invention comprises an n-type doped organic layer that is located between the light emitting units, and if necessary, comprises n-type doped organic layer as an organic layer contacted with the second electrode.

The n-type organic layer injects holes into the organic layer under a low electric field. The n-type organic layer has the LUMO energy of about 4 to 7 eV and the electron mobility of about $10^{-8}$ $cm^2/Vs$ to about 1 $cm^2/Vs$, specifically about $10^{-6}$ $cm^2/Vs$ to about $10^{-2}$ $cm^2/Vs$. When the electron mobility is less than about $10^{-8}$ $cm^2/Vs$, it is not easy to inject holes. When the electron mobility is greater than about 1 $cm^2/Vs$, such an organic compound is crystalline rather than amorphous. Such a crystalline organic compound is not easily used for organic EL device.

The n-type organic layer is formed by a vacuum evaporation or solution process. The n-type organic layer includes, but not limited to, 2,3,5,6-tetrafluoro-7,7,8,8-tetracyanoquinodimethane (F4TCNQ), fluoro-substituted 3,4,9,10-perylenetetracarboxylic dianhydride (PTCDA), cyano-substituted PTCDA, naphthalene-tetracarboxylic-dianhydride (NTCDA), fluoro-substituted NTCDA, cyano-substituted NTCDA, or compound of following formula 23.

[Formual 23]

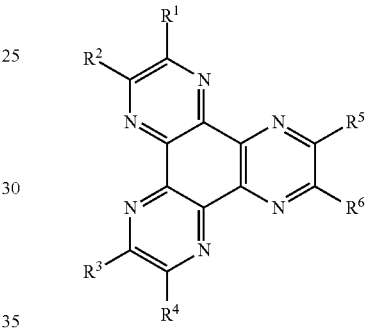

In Formula 23, each of $R^1$ to $R^6$ is selected from a group consisting of hydrogen, halogen atoms, nitrile (—CN), nitro (—$NO_2$), sulfonyl (—$SO_2R$), sulfoxide (—SOR), sulfonamide (—$SO_2NR$), sulfonate (—$SO_3R$), trifluoromethyl (—$CF_3$), ester (—COOR), amide (—CONHR or —CONRR'), substituted or unsubstituted straight or branched chain $C_1$-$C_{12}$ alkoxy, substituted or unsubstituted straight or branched $C_1$-$C_{12}$ alkyl, substituted or unsubstituted aromatic or non-aromatic heterocyclic rings, substituted or unsubstituted aryl, substituted or unsubstituted mono- or di-arylamine, and substituted or unsubstituted aralkylamine, and each of R and R' are selected from a group consisting of substituted or unsubstituted $C_1$-$C_{60}$ alkyl, substituted or unsubstituted aryl, and substituted or unsubstituted 5-7 membered heterocyclic rings.

Examples of the compound of Formula 23 may include compounds represented by the following Formulae 23-1 to 23-6.

[Formula 23-1]

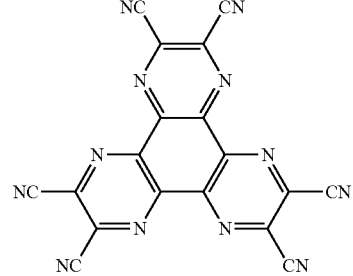

[Formula 23-2]

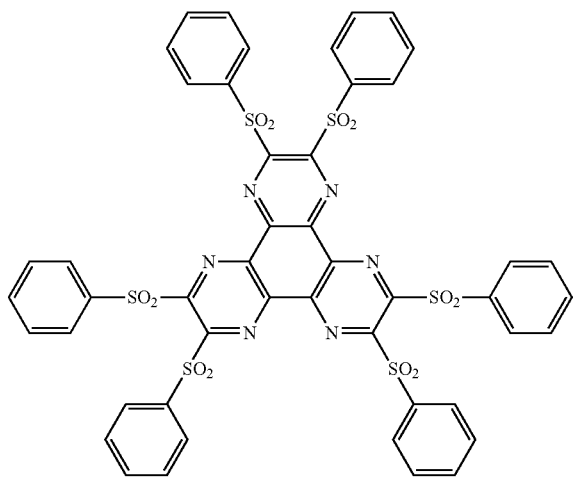

[Formula 23-3]

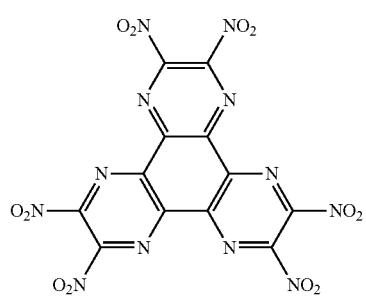

[Formula 23-4]

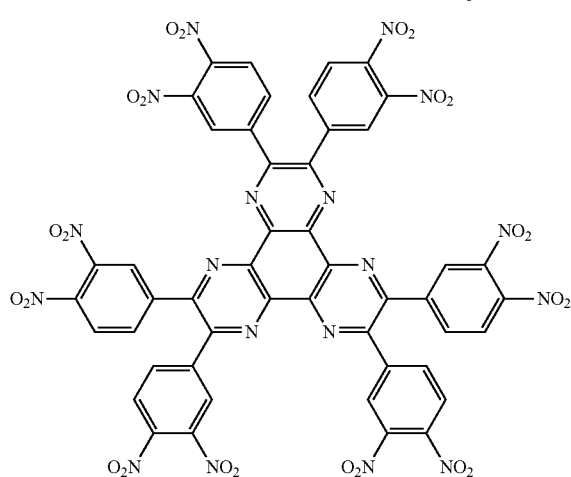

[Formula 23-5]

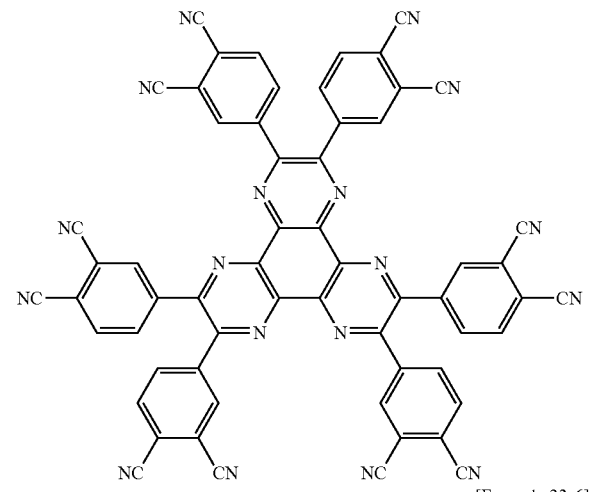

[Formula 23-6]

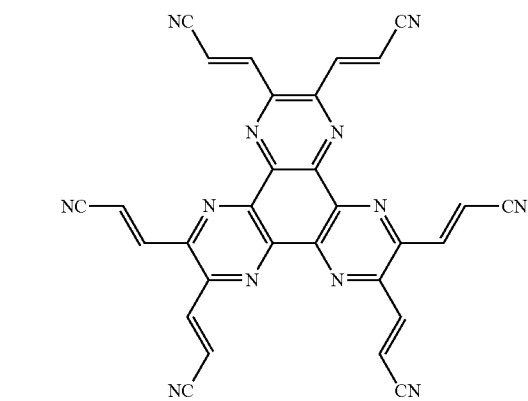

The other examples, method for preparation and features of the formula 26 is disclosed in US Patent Application No. 2002-0158242, U.S. Pat. No. 6,436,559 and U.S. Pat. No. 4,780,536, the disclosures of which are incorporated herein by reference in its entirety.

The lighting emitting units may further comprise at least one organic layer selected from the group consisting of a hole injection layer, a hole transporting layer, a light emitting layer, an electron transporting layer and an electron injection layer.

The hole injection layer or the hole transporting layer may be formed as a p-type organic layer. The p-type hole injection layer or the p-type hole transporting layer may be formed NP conjunction with the n-type organic layer, and the hole formed from the NP conjunction is transported to the light emitting layer through the p-type hole injection layer or the p-type hole transporting layer.

The hole injection layer or the hole transporting layer can be formed of a p-type organic layer. Because the p-type hole injection layer or the p-type hole transporting layer and the n-type organic layer form an NP conjunction, the holes formed at the NP conjunction are transported to the emitting layer through the p-type hole injection layer or the p-type hole transporting layer.

The HOMO energy level of p-type hole injection layer or the p-type hole transporting layer and LUMO energy level satisfy the following energy relation equation.

$$E_{pH} - E_{nL} \leq 1 \text{ eV, preferably } E_{pH} - E_{nL} \leq 0.5 \text{ eV}$$

The p-type hole injection layer or the p-type hole transporting layer includes, but not limited to, an arylamine compound, a conductive polymer, or a block copolymer having together conjugated portion and non-conjugated portion.

Because a hole transporting and an electron transporting are occurred at the same time in the emitting layer, the emitting layer has both p-type semiconductor property and n-type semiconductor property. The emitting layer has an n-type emitting layer in which the electron transporting is faster than the hole transporting, or a p-type emitting layer in which the hole transporting is faster than the electron transporting.

Because the electrons transporting is faster than the holes transporting in the n-type emitting layer, the light is emitted at the interface between the hole transporting layer and the emitting layer. It would be better that the LUMO energy of the hole transporting layer is greater than the LUMO energy of the emitting layer in order to have high luminescence efficiency. The n-type emitting layer includes, but not limited to, aluminum tris(8-hydroxyquinoline) ($Alq_3$); 8-hydroxyquinoline berillyum (BAlq); benzoxazole compound, benzothiazole compound, or benzimidazol compound; polyfluorene compound; or silacyclopentadiene (silole).

In the p-type emitting layer, the holes transport faster than electrons do, so that the light is emitted at the interface between the electron transporting layer and the emitting layer. Therefore, it would be better that HOMO energy of the electron transporting layer is lower than the HOMO energy of the emitting layer in order to have high luminescence efficiency.

The high luminescence efficiency obtained by changing the LUMO energy of the hole transporting layer in the p-type emitting layer is less than that in the n-type emitting layer. Therefore, the organic luminescence device having the p-type emitting layer may have the NP conjunction between the n-type organic compound layer and the p-type emitting layer without forming the hole injection layer and the hole transporting layer. The p-type emitting layer includes, but not limited to, a carbazole compound, an anthracene compound, a poly(phenylene vinylenes) (PPV) high molecular compound, or a spiro compound.

The electron transporting layer has a high electron mobility to easily receive and transport electrons from/to the cathode and the emitting layer. The electron transporting layer includes, but not limited to, aluminum tris(8-hydroxyquinoline) ($Alq_3$), organic compound having $Alq_3$ structure, flavone hydroxide-metal complex, or silacyclopentadiene (silole).

Second Electrode

The second electrode has low work function in order to easily inject electrons into the p-type organic compound layer such as the hole transporting layer. The cathode includes, but not limited to, metal, such as, magnesium, calcium, sodium, kalium, titanium, indium, yittrium, lithium, gadolinium, aluminum, silver, tin, and lead or alloy thereof; or multiple structured materials such as LiF/Al or $LiO_2$/Al. The second electrode can be formed of the same material to the first electrode. Alternatively, either the second electrode or the first electrode includes a transparent material.

MODE FOR INVENTION

Various aspects and features of the present invention will be further discussed in terms of the examples. The following examples are intended to illustrate various aspects and features of the present invention, but no limited the scope of the present invention.

EXAMPLE

Example 1

Determination of HOMO and LUMO Energies of HAT with UPS and UV-VIS Absorption

Hexanitrile hexaazatriphenylene (HAT) was used for an organic compound having n-type semiconductor property. The HOMO energy of the HAT was determined by Ultraviolet Photoelectron Spectroscopy (UPS) in which the Vacuum UV line (about 21.20 eV) emitted from a Helium lamp was illustrated to a sample under an ultra high vacuum ($10^{-8}$ Ton) and the kinetic energy of the electrons emitted from the sample was examined. With the UPS, the work function of metals and the ionization energy (HOMO energy and Fermi energy) of organic compounds were determined, respectively. The kinetic energy of the emitted electrons was the energy difference between the electron binding energy of the sample and the vacuum UV energy (about 21.2 eV). Therefore, the distribution of the binding energy of the materials contained in the sample was determined by analyzing the distribution of the kinetic energy of the emitted electrons. When the kinetic energy of the emitted electrons had a maximum value, the binding energy of the sample had a minimum value. The minimum value of the binding energy was used in determining the work function (Fermi energy) and the HOMO energy of the sample.

The work function of gold was determined by using a gold film. The HAT was vacuum adsorbed to the gold film, and the HOMO energy of the HAT was determined by analyzing the kinetic energy of the electrons emitted from the HAT. FIG. 7 is a graph showing UPS data of the gold film and the HAT film disposed on the gold film. H. Ishii, et al., Advanced Materials, 11, 605-625 (1999). The HAT film has a thickness of 20 nm.

Figure 6:
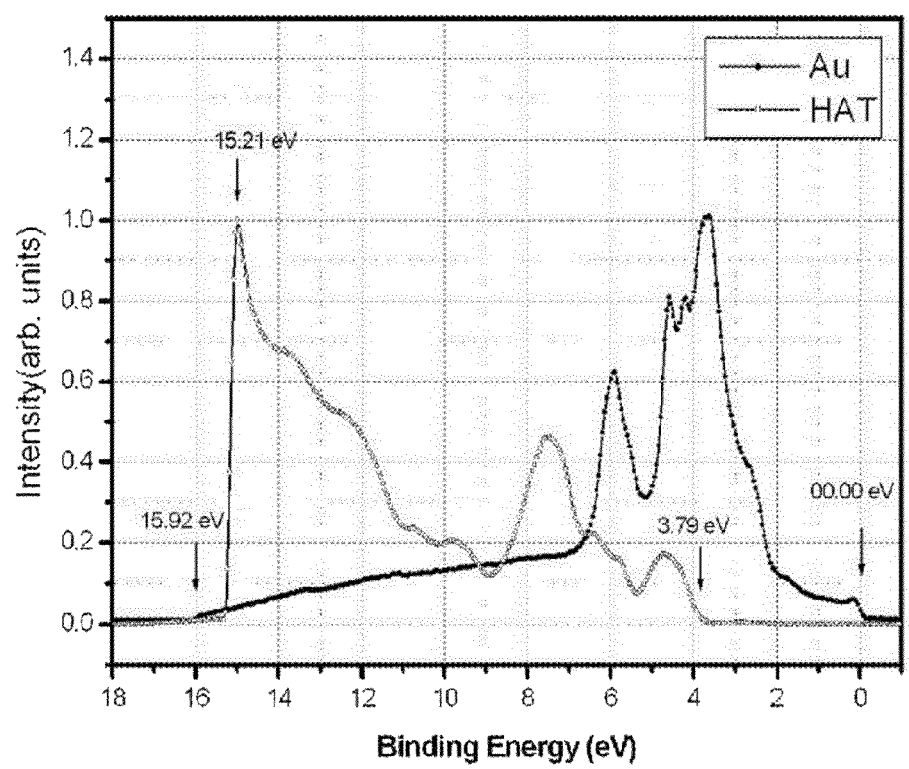
FIG. 6 is a graph that illustrates UPS (Ultraviolet Photoelectron Spectrum) data of a gold film and an HAT film that is disposed on the gold film.

Referring to FIG. 6, an X-axis indicates the binding energy (eV), which was determined, with respect to the work function of the gold film. The work function of the gold was about 5.28 eV, which was calculated by subtracting the maximum value (about 15.92 eV) of the binding energy from the energy (about 21.20 eV) of the light illustrated to the HAT film. The HOMO energy of the HAT film was about 9.80 eV, which was calculated by subtracting the difference between the minimum value (about 3.79 eV) and the maximum value (about 15.92 eV) of the binding energy from the light energy (about 21.20 eV). The Fermi energy of the HAT film is about 6.02V.

The UV-VIS spectrum was taken with the organic compound, which was formed by vacuum deposition of the HAT on a surface of a glass. The absorption edge was analyzed, and the band gap was determined to be about 3.26 eV. Therefore, the LUMO energy of the HAT was about 6.54 eV, which could be changed by an exciton binding energy. Because the HOMO energy of about 6.54 eV was greater than the Fermi energy of about 6.02 eV, the exciton binding energy had to have about 0.52 eV or more so that the LUMO energy was less than the Fermi energy. The exciton binding energy of an organic compound generally would be about 0.5 eV to about 1 eV, and thus the LUMO energy of the HAT would be about 5.54 to 6.02 eV.

Comparative Example 1

On the substrate, as IZO, the transparent anode (first electrode) that had the thickness of 1000 Å was formed by using the sputtering method, and HAT was vacuum deposited by heat thereon to form the n-type organic that had the thickness of 500 Å. NPB of the following Formula was vacuum deposited thereon to form the hole transport layer that had the thickness of 400 Å to form the NP conjunction.

In addition, Ir(ppy)$_3$ of the following Formula was doped on CBP of the following Formula in an amount of 10 wt %, and the light emitting layer that had the thickness of 300 Å was constituted with the doped organic layer.

In addition, BAlq that was the hole interrupting layer material of the following Formula was formed in a thickness of 50 Å.

The electron transport layer material of the following Formula was formed in a thickness of 150 Å thereon. Ca was doped in an amount of 10 wt % to the electron transport material of the following Formula thereon, and the doped electron transport layer was formed in a thickness of 50 Å. Aluminium was formed on the doped electron transport layer as the reflection cathode (second electrode) in a thickness of 1000 Å to manufacture the unit organic light emitting device. At this time, the device structure is IZO/HAT/NPB/CBP+Ir(ppy)$_3$/BAlq/ETL/Ca+ETL/Al.

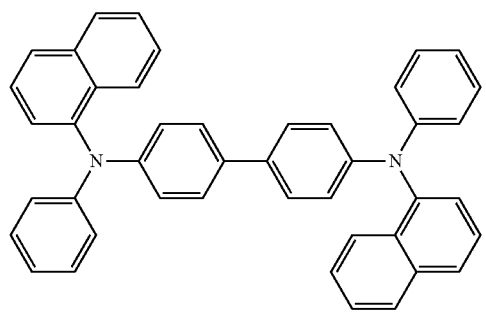

[NPB]

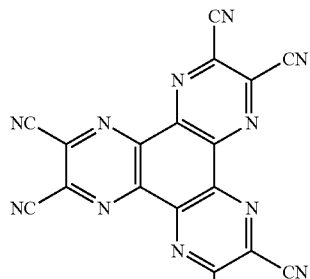

[HAT]

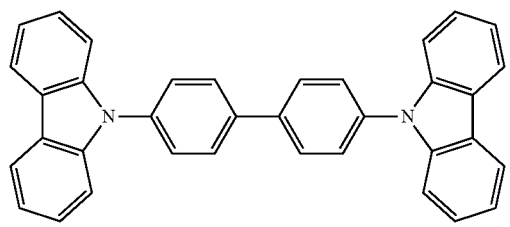

[CBP]

-continued

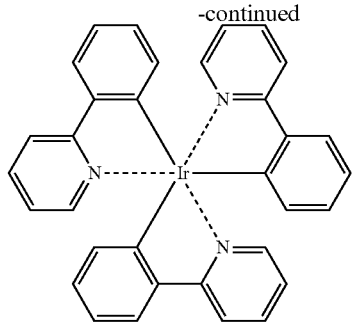

[Ir(ppy)$_3$]

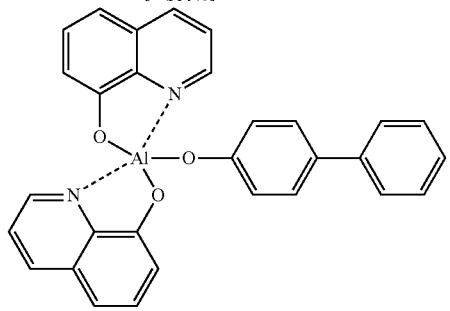

[BAlq]

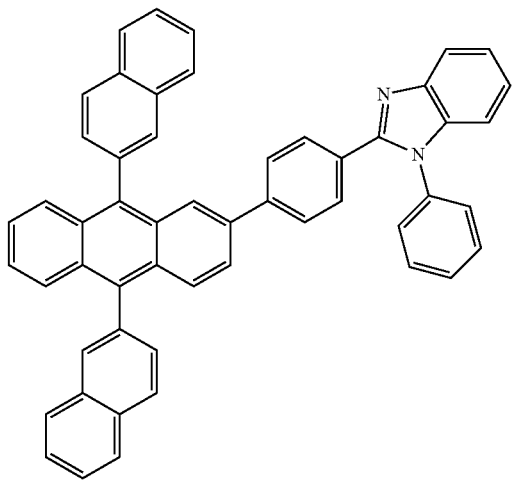

[electron transporting material]

In the above process, the deposition rate of the organic was maintained to 0.5 to 1.0 Å/sec, and the degree of vacuum during the deposition was maintained to $2\times10^{-7}$ to $2\times10^{-8}$ torr.

Example 2

On the substrate, as IZO, the transparent anode (first electrode) that had the thickness of 1000 Å was formed by using the sputtering method, and HAT was vacuum deposited by heat thereon to form the n-type organic that had the thickness of 500 Å. NPB of the following Formula was vacuum deposited thereon to form the hole transport layer that had the thickness of 400 Å to form the NP conjunction.

In addition, Ir(ppy)$_3$ of the following Formula was doped on CBP of the following Formula in an amount of 10 wt %, and the light emitting layer that had the thickness of 300 Å was constituted with the doped organic layer.

In addition, BAlq that was the hole interrupting layer material of the following Formula was formed in a thickness of 50 Å.

The electron transport layer material of the following Formula was formed in a thickness of 150 Å thereon. Ca was doped in an amount of 10 wt % to the electron transport material of the following Formula thereon, and the doped electron transport layer was formed in a thickness of 50 Å to manufacture the unit device structure of HAT/NPB/CBP+Ir(ppy)$_3$/BAlq/ETL/Ca+ETL. On the doped Ca electron transport layer, the HAT/NPB/CBP+Ir(ppy)$_3$/BAlq/ETL/Ca+ETL unit device layer was formed by using the same method as the above deposition method of the unit device in the same thickness as the above unit device to form the IZO/HAT/NPB/CBP+Ir(ppy)$_3$/BAÅlq/ETL/Ca+ETL/HAT/NPB/CBP+Ir(ppy)$_3$/BAlq/ETL/Ca+ETL/Al organic layer in which two unit light emitting devices are layered.

On the second Ca doped electron transport layer, aluminium was formed as the second electrode in a thickness of 1000 Å to manufacture the unit organic light emitting device.

In the above process, the deposition rate of the organic was maintained to 0.5 to 1.0 Å/sec, and the degree of vacuum during the deposition was maintained to $2\times10^{-7}$ to $2\times10^{-8}$ torr.

Example 3

The stacked organic light emitting diode was manufactured by using the same method as the method of Example 3, except that 10 vol % of Mg was used instead of Ca as the n-type doped electron transport layer. This stacked diode structure is IZO/NPB/CBP+Ir(ppy)$_3$/BAlq/ETL/Mg+ETL/HAT/NPB/CBP+Ir(ppy)$_3$/BAlq/ETL/Mg+ETL/Al.

Comparative Example 2

The stacked organic light emitting diode was manufactured by using the same method as Example 2, except that on the substrate, as IZO, the transparent anode (first electrode) that had the thickness of 1000 Å was formed by using the sputtering method, and NPB of the following Formula was vacuum deposited thereon to form the hole transport layer that had the thickness of 900 Å. This stacked organic diode structure is IZO/NPB/CBP+Ir(ppy)$_3$/BAlq/ETL/Ca+ETL/HAT/NPB/CBP+Ir(ppy)$_3$/BAlq/ETL/Ca+ETL/A Comparative Example 3

The stacked organic light emitting diode was manufactured by using the same method as Example 2, except that on the substrate, as IZO, the transparent anode (first electrode) that had the thickness of 1000 Å was formed by using the sputtering method, and NPB of the following Formula was vacuum deposited thereon to form the hole transport layer that had the thickness of 900 Å, the electron transport layer of the second unit light emitting device that was contacted with the second electrode was deposited in a thickness of 200 Å, and LiF was deposited as the electron injection layer thereon in a thickness of 15 Å. This stacked organic diode structure is IZO/NPB/CBP+Ir(ppy)$_3$/BAlq/ETL/Ca+ETL/HAT/NPB/CBP+Ir(ppy)$_3$/BAlq/ETL/LiF/Al.

TABLE 1

| @ 10 mA/cm$^2$ | Driving voltage (V) | Current efficiency (cd/A) | Power efficiency (lm/W) |
|---|---|---|---|
| Example 2 | 8.5 | 98 | 36.2 |
| Example 3 | 9.3 | 96 | 32.4 |
| Comparative Example 1 | 4.5 | 52 | 36.3 |
| Comparative Example 2 | 14.2 | 100 | 22.1 |
| Comparative Example 3 | 15.2 | 92 | 19.0 |

As seen from Table 1, in the case of the device of Example 3 in which two devices of Comparative Example 1 were layered, the voltage to the device of Comparative Example 1 was increased by about two times from 4.5 V to 8.5 V, and the current efficiency was increased by about two times from 52 cd/A to 98 cd/A because of the layering. This shows that it is possible to manufacture the stacked organic light emitting diode that has the same power efficiency as the single device without a reduction of light emitting power efficiency of 36 μm/W. In addition, like Example 4, in the case of when Mg was used in the electron transport layer instead of Ca, there was a little power efficiency reduction in respects to Ca, but it acted well as the stacked diode. That is, in the structure in which two light emitting units are layered, in the case of when two NP conjunction layers and two n-type doping layer are used, it is possible to manufacture the stacked diode that has very excellent efficiency and brightness per unit area that is higher than known device by two times.

In the case of Comparative Examples 2 and 3, in the device structure in which two light emitting units are layered, in the case of when one NP conjunction or one n-doped layer is used, the power efficiency is largely lowered as compared to the case of when two NP conjunctions and two n-doped layers are used. This shows that the NP conjunction and the n-type organic improve the charge generation and charge injection characteristics, and act well as the low voltage driving and intermittent connector layer. In addition, the electron generation and injection characteristics aid the balancing of electrons and holes of the light emitting layer.

That is, it can be seen that in the stacked diode in which n unit light emitting devices are layered, if the charge generation layer by n NP conjunctions and n n-type doped organics are used, it is possible to manufacture the organic light emitting device having good efficiency.

The invention claimed is:

1. A stacked organic light emitting diode comprising:
a first electrode;
a second electrode;
at least two light emitting units that are located between the first electrode and the second electrode; and
an n-type doped organic layer that is located between the at least two light emitting units,
wherein at least one of the at least two light emitting units comprises an n-type organic layer and a p-type organic layer that form an NP conjunction and satisfy the following energy relation equation;

$E_{pH}-E_{nL} \le 1$ eV wherein $E_{nL}$ is a LUMO (lowest unoccupied molecular orbital) energy level of the n-type organic layer and $E_{pH}$ is a HOMO (highest occupied molecular orbital) energy level of the p-type organic layer,
wherein the n-type organic layer that forms the NP conjunction with the p-type organic layer is in contact with the n-type doped organic layer, and wherein one of the at least two light emitting units that is in contact with the second electrode further comprises an n-type doped organic layer.

2. The stacked organic light emitting diode according to claim 1, wherein the n-type organic layer that forms the NP conjunction with the p-type organic layer is in contact with the first electrode, in one of the at least two light emitting units that is in contact with the first electrode, and satisfies the following energy relation equation:

$$0\ eV < E_{nL} - E_{Fl} \leq 4\ eV$$

wherein $E_{Fl}$ is a Fermi energy level of the first electrode, and $E_{nL}$ is a LUMO (lowest unoccupied molecular orbital) energy level of the n-type organic layer.

3. The stacked organic light emitting diode according to claim 1, wherein the n-type organic layer that forms the NP conjunction with the p-type organic layer is in contact with the n-type doped organic layer, in one of the at least two light emitting units except one of the at least two light emitting units that is in contact with the first electrode.

4. The stacked organic light emitting diode according to claim 1, wherein the n-type doped organic layer that is comprised in one of the at least two light emitting units that is in contact with the second electrode is in contact with the second electrode.

5. The stacked organic light emitting diode according to claim 1, wherein the at least two light emitting units each comprise at least one light emitting layer.

6. The stacked organic light emitting diode according to claim 1, wherein in the n-type doped organic layer, the n-type doping material comprises at least one metal that are selected from the group consisting of alkali metal, alkali earth metal, La, Ce, Pr, Nd, Sm, Eu, Tb, Th, Dy, Ho, Er, Em, Gd, Yb, Lu, Y and Mn, or a metal compound that comprises at least one metal.

7. The stacked organic light emitting diode according to claim 1, wherein in the n-type doped organic layer, the n-type doping material is a material that includes cyclopentadiene, cycloheptatriene, 6-membered hetero ring or a condensed ring that comprises these rings.

8. The stacked organic light emitting diode according to claim 1, wherein in the n-type doped organic layer, the doping organic material is a compound comprising a functional group that is selected from the group consisting of an imidazole group, an oxazole group, a thiazole group, a quinoline group and a phenanthroline group.

9. The stacked organic light emitting diode according to claim 1, wherein the n-type doped organic layer that is comprised in one of the at least two light emitting units that is in contact with the second electrode is an electron injection layer, an electron transport layer or an electron injection and transport layer.

10. The stacked organic light emitting diode according to claim 1, wherein the p-type organic layer is a hole injection layer, a hole transport layer, or a light emitting layer.

11. The stacked organic light emitting diode according to claim 1, wherein the n-type organic layer has a LUMO energy level that is in the range of 4 to 7 eV.

12. The stacked organic light emitting diode according to claim 1, wherein the n-type organic layer comprises organic material selected from the group consisting of 2,3,5,6-tetrafluoro-7,7,8,8-tetracyanoquinodimethane (F4TCNQ), fluorine-substituted 3,4,9,10-perylenetetracarboxylic dianhydride (PTCDA), cyano-substituted PTCDA, naphthalene-tetracarboxylic dianhydride (NTCDA), fluorine-substituted NTCDA, cyano-substituted NTCDA, and a compound that is represented by the following Formula 23:

[Formula 23]

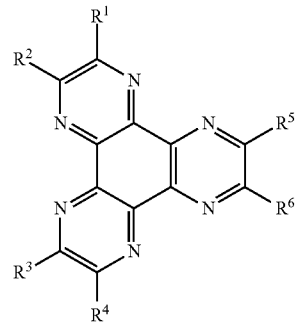

wherein $R^1$ to $R^6$ are each selected from the group consisting of hydrogen, a halogen atom, nitrile (—CN), nitro (—NO$_2$), sulfonyl (—SO$_2$R), sulfoxide (—SOR), sulfonamide (—SO$_2$NR), sulfonate (—SO$_3$R), trifluoromethyl (—CF$_3$), ester (—COOR), amide (—CONHR or —CONRR'), substituted or unsubstituted straight- or branched-chained $C_1$-$C_{12}$ alkoxy, substituted or unsubstituted straight- or branched-chained $C_1$-$C_{12}$ alkyl, substituted or unsubstituted aromatic or nonaromatic hetero ring, substituted or unsubstituted aryl, substituted or unsubstituted mono- or di-arylamine, and substituted or unsubstituted aralkylamine, and R and R' are each selected from the group consisting of substituted or unsubstituted $C_1$-$C_{60}$ alkyl, substituted or unsubstituted aryl and substituted or unsubstituted 5-7-membered hetero ring.

13. The stacked organic light emitting diode according to claim 1, wherein the first electrode is an anode and the second electrode is a cathode.

14. The stacked organic light emitting diode according to claim 1, wherein the organic light emitting diode has an inverted structure in which a cathode, an organic layer and an anode are sequentially formed on a substrate.

15. The stacked organic light emitting diode according to claim 1, wherein the first electrode and the second electrode are formed of the same material.

16. The stacked organic light emitting diode according to claim 1, wherein at least one of the first electrode and the second electrode comprises a transparent material.

17. A stacked organic light emitting diode comprising:
a first electrode;
a second electrode;
at least two light emitting units that are located between the first electrode and the second electrode; and
an n-type doped organic layer and an n-type organic layer that are in contact with each other and are located between the at least two light emitting units, and
wherein one of the at least two light emitting units that is in contact with the second electrode further comprises an n-type doped organic layer.

18. The stacked organic light emitting diode according to claim 17,
wherein at least one of the at least two light emitting units comprises a p-type organic layer, and
wherein the n-type organic layer and the p-type organic layer form an NP conjunction and satisfy the following energy relation equation:

$$E_{pH} - E_{nL} \leq 1\ eV$$

wherein $E_{nL}$ is a LUMO (lowest unoccupied molecular orbital) energy level of the n-type organic layer and $E_{pH}$ is a HOMO (highest occupied molecular orbital) energy level of the p-type organic layer.

* * * * *